(12) United States Patent
Yamagata et al.

(10) Patent No.: US 8,199,237 B2
(45) Date of Patent: Jun. 12, 2012

(54) IMAGING DEVICE, CONTROL METHOD THEREFOR, AND CAMERA

(75) Inventors: Yuuki Yamagata, Kanagawa (JP); Ken Koseki, Kanagawa (JP)

(73) Assignee: Sony Corporation, Tokyo (JP)

( * ) Notice: Subject to any disclaimer, the term of this patent is extended or adjusted under 35 U.S.C. 154(b) by 320 days.

(21) Appl. No.: 12/686,032

(22) Filed: Jan. 12, 2010

(65) Prior Publication Data

US 2010/0182472 A1  Jul. 22, 2010

(30) Foreign Application Priority Data

Jan. 20, 2009 (JP) ................................. 2009-010030

(51) Int. Cl.
*H04N 5/335* (2011.01)
(52) U.S. Cl. ........................................ 348/308; 348/294
(58) Field of Classification Search .................. 348/294, 348/308; 250/208.1
See application file for complete search history.

(56) References Cited

U.S. PATENT DOCUMENTS

| 6,838,651 | B1 | 1/2005 | Mann | |
|---|---|---|---|---|
| 6,995,797 | B2 * | 2/2006 | Takayanagi | 348/308 |
| 8,063,350 | B2 * | 11/2011 | McGarry et al. | 250/208.1 |
| 2005/0195304 | A1 | 9/2005 | Nitta et al. | |
| 2005/0237407 | A1 | 10/2005 | Bae | |
| 2006/0012698 | A1 * | 1/2006 | Nitta et al. | 348/308 |

FOREIGN PATENT DOCUMENTS

| JP | 2005-278135 | 10/2005 |
|---|---|---|
| JP | 2005-318544 | 11/2005 |

* cited by examiner

*Primary Examiner* — Tuan Ho
(74) *Attorney, Agent, or Firm* — SNR Denton US LLP

(57) ABSTRACT

An imaging device includes: a pixel section having a plurality of pixel circuits arranged in a matrix form; and a signal processing section that processes an output signal read from the pixel section. The pixel section includes a first output signal line, at least one first color pixel circuit connected to the first output signal line, a second output signal line, and at least one second color pixel circuit adjacent to the first color pixel circuit in a row direction thereof and connected to the second output signal line. The signal processing section includes a first signal processing circuit, a second signal processing circuit, a selection circuit, a first current source, a second current source, a current source selection circuit, a first connection node, and a second connection node.

6 Claims, 16 Drawing Sheets

| SELECTION SIGNAL S1 | OUTPUT O |
|---|---|
| L | A |
| H | B |

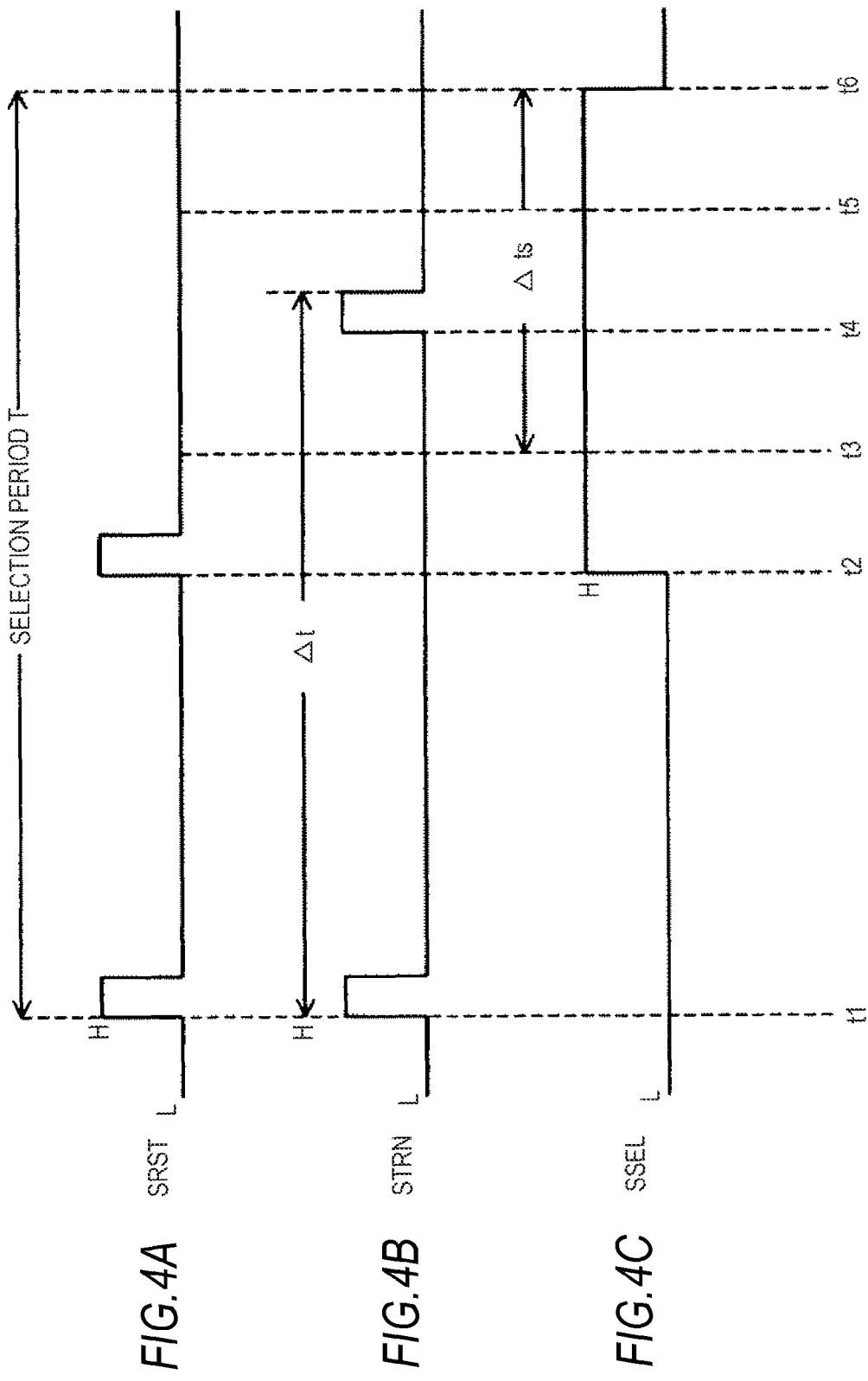

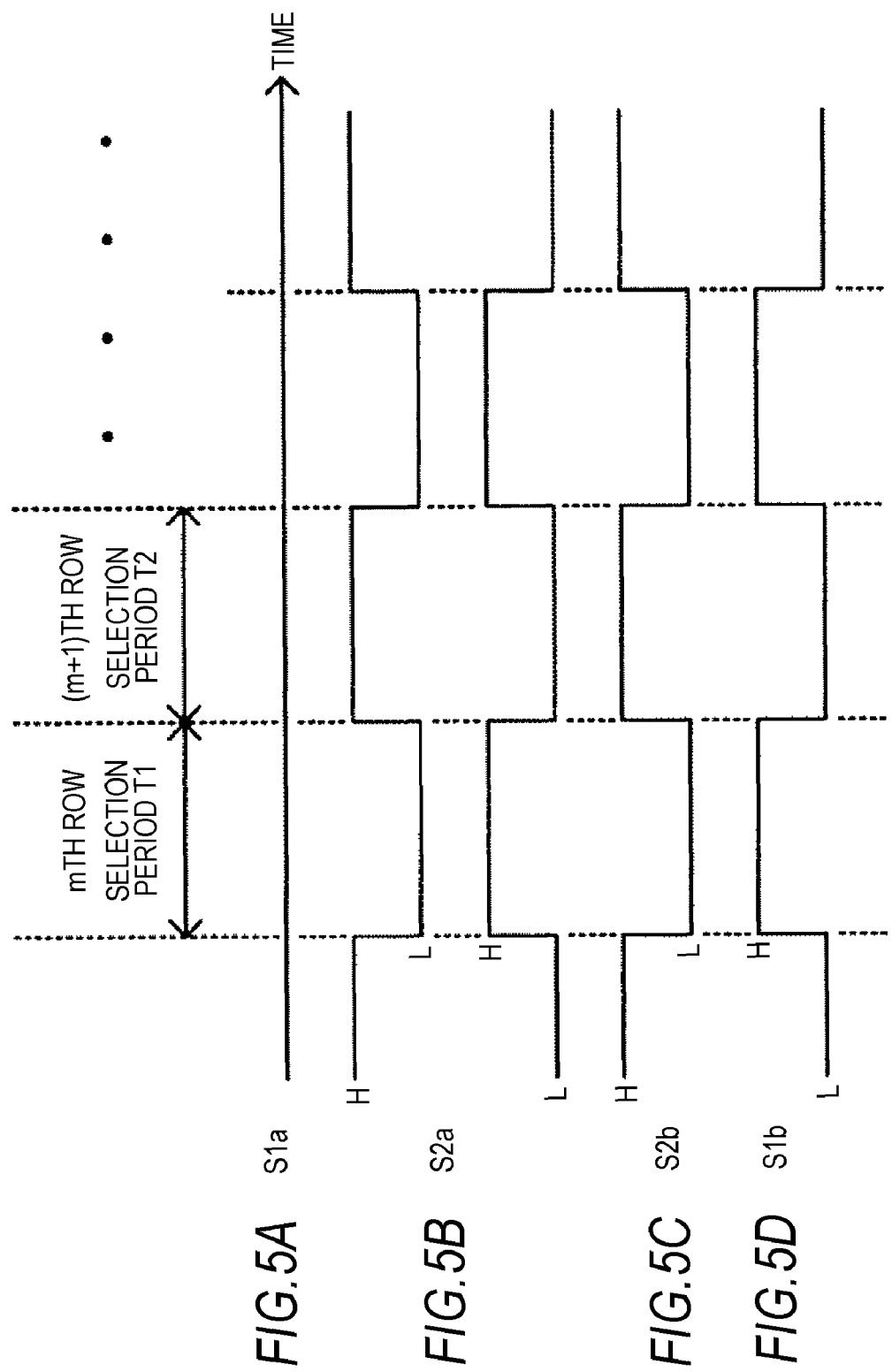

| PATH SELECTION SWITCH SW1a, CURRENT SOURCE SELECTION SWITCH SW2b | SELECTION SIGNAL S | OUTPUT O |
|---|---|---|
| | L | A |
| | H | B |

| PATH SELECTION SWITCH SW1b, CURRENT SOURCE SELECTION SWITCH SW2a | SELECTION SIGNAL S | OUTPUT O |
|---|---|---|
| | L | B |
| | H | A |

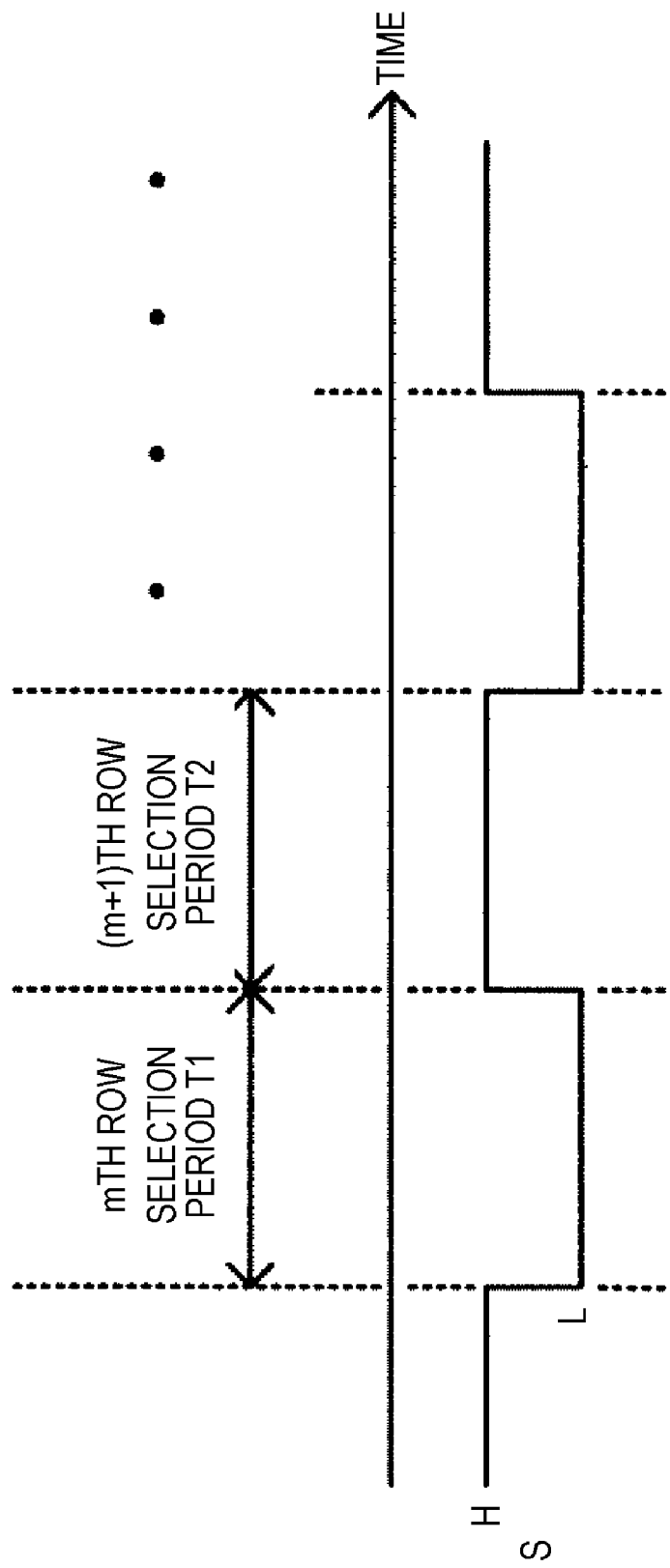

Prior Art    FIG.14

IMAGING DEVICE, CONTROL METHOD THEREFOR, AND CAMERA

BACKGROUND OF THE INVENTION

1. Field of the Invention

The present invention relates to an imaging device, such as a CMOS (Complementary Metal Oxide Semiconductor) image sensor, a control method therefor, and a camera.

2. Description of the Related Art

CMOS image sensors with various architectures to image a subject at a high speed have been proposed. For example, there is a CMOS image sensor which has an A/D converter provided for a column circuit to achieve faster imaging and lower noise (see JP-A-2005-278135 (Patent Document 1), for example).

When the pitch between pixel circuits becomes narrower with an improved scale of the integration of the pixel circuits, it is difficult to install a plurality of CDS circuits in one column (one stage). There is a CMOS image sensor which achieves integration of pixel circuits by arranging a plurality of CDS circuits separated in upper and lower stages of a pixel section and allowing two systems of CDS circuits to process output signals of the pixel circuits (see JP-A-2005-318544 (Patent Document 2), for example). The outline of a CMOS image sensor on the basis of the method disclosed in Patent Document 2 will be described in connection with FIG. 14.

FIG. 14 is a schematic configurational diagram showing an example of the configuration of a general CMOS image sensor.

A CMOS image sensor 3 has a selection control circuit (SCTLC) 34, a current source 36, a CDS circuit (CDS) 38, and a column drive circuit (HSCNC) 310 arranged at the upper stage of a pixel section 31. A selection control circuit 35, a current source 37, a CDS circuit 39, and a column drive circuit 311 are arranged at the lower stage of the pixel section 31.

The upper stage indicates the side where a first column pixel circuit 32, and the lower stage indicates the side where a last column pixel circuit 32.

A plurality of pixel circuits 32 in the pixel section 31 are laid out in a Bayer pattern. The pixel circuits 32 that sense Gr (green) and the pixel circuits 32 that sense R (red) are alternately laid out in an mth row, while the pixel circuits 32 that sense B (blue) and the pixel circuits 32 that sense Gb (green) are alternately laid out in an (m+1)th row.

A row drive circuit (VSCNC) 33 drives those pixel circuits 32 are driven to read charges therefrom. In case of reading charges, it is desirable that one of the CDS circuits should process voltage signals output from the Gr and Gb pixel circuits 32 of similar colors in order to prevent horizontal noise or the like (see U.S. Pat. No. 6,838,651 (Patent Document 3)).

In this respect, when the row drive circuit 33 applies a drive signal to a drive signal line DRNL(m) to drive the pixel circuits 32 in the mth row, the upper-stage selection control circuit 34 controls a switch SW31 to connect the upper-stage CDS circuit 38 to a vertical signal line VSL(n).

At the same time, the lower-stage selection control circuit 35 controls a switch SW32 to connect the lower-stage CDS circuit 39 to a vertical signal line VSL(n+1).

Reading of charges from Gr and Gb pixel circuits 32 of similar colors will be described below in connection with FIGS. 15A and 15B.

FIGS. 15A and 15B are schematic configurational diagrams each showing one state of the general CMOS image sensor. FIGS. 15A and 15B show only the components necessary for the explanation.

An amplification transistor which constitutes a part of the Gr pixel circuit 32 in the mth row, and the current source 37 located at the succeeding stage form a source follower circuit. With the source follower circuit formed, the CMOS image sensor 3 reads charges from the Gr pixel circuit 32.

At this time, as shown in FIG. 15A, a constant current flows toward the current source 37 from the Gr pixel circuit 32, and a voltage signal (readout charges) output to a node ND31 from the Gr pixel circuit 32 is input to the upper-stage CDS circuit 38 via the switch SW31.

Next, in case of reading charges from pixel circuits 32 in the (m+1)th row, the row drive circuit 33 applies the drive signal to a drive signal line DRNL(m+1), and the upper-stage selection control circuit 34 controls the switch SW31 to connect the upper-stage CDS circuit 38 to the vertical signal line VSL(n+1).

At the same time, the lower-stage selection control circuit 35 controls the switch SW32 to connect the lower-stage CDS circuit 39 to the vertical signal line VSL(n+1).

An amplification transistor which constitutes a part of the Gb pixel circuit 32 in the (m+1)th row, and the current source 36 located at the preceding stage form a source follower circuit.

At this time, as shown in FIG. 15B, a constant current flows toward the current source 36 from the Gb pixel circuit 32, and a voltage signal output to a node ND32 from the Gb pixel circuit 32 is input to the upper-stage CDS circuit 38 via the switch SW31.

The CMOS image sensor 3 shown in FIG. 14 selects a transmission path for a voltage signal by switching the switch SW31, SW32 to allow the CDS circuit 38 of the same stage to process the voltage signals output from the Gb and Gr pixel circuits 32 of similar colors.

However, the CMOS image sensor 3 has the following disadvantages. Because a current source is not present on the transmission path for the voltage signal output from the Gr pixel circuit 32 (transmission path from the node ND31 to the CDS circuit 38), as shown in FIG. 15A, a (bias) current does not flow in the transmission path, so that the potential on the transmission path is kept the same.

However, because a current source is present on the transmission path for the voltage signal output from the Gb pixel circuit 32 (transmission path from the node ND32 to the CDS circuit 38), as shown in FIG. 15B, a (bias) current flows in the transmission path, causing a voltage drop according to the wiring load of the vertical signal line VSL(n+1), so that the potential on the transmission path is not kept the same.

The Gb pixel circuit 32 positioned farthest from the current source 36 has a greater voltage drop than the Gb pixel circuit 32 positioned closest to the current source 36, producing a difference in input operational point by the voltage drop between the original input operational point of the CDS circuit 38 and the actual input operational point thereof. The input operational point is the voltage on which the CDS circuit 38 operates. The difference between the input operational points of the CDS circuit 38 causes vertical noise and shading.

To avoid such a problem, a CMOS image sensor 3a shown in FIG. 16 employs the following configuration.

FIG. 16 is a schematic configurational diagram showing another example of the general CMOS image sensor.

As shown in FIG. 16, the CMOS image sensor 3a has Gb and B pixel circuits 32 in the (m+1)th row arranged, shifted by one column from Gr and R pixel circuits 32 in the mth row. Accordingly, the Gr and Gb pixel circuits 32 are connected to a common vertical signal line VSL(n), and the R and B pixel circuits 32 are connected to a common vertical signal line VSL(n+1). This layout of the pixel circuits 32 keeps the transmission path for a voltage signal at the same potential in order to reduce vertical noise and shading.

SUMMARY OF THE INVENTION

However, the CMOS image sensor 3a has the pixel circuits shifted row by row, producing wasteful space which stands in the way of improving the integration scale of pixel circuits.

Due to the layout-originated problem, it is difficult to adopt shared type pixel circuits in the CMOS image sensor 3a as shown in FIG. 16. Shared type pixel circuits are such that a plurality of (e.g., four) pixel circuits share a single floating diffusion, an amplification transistor and the like, so that output signals of the individual pixel circuits are output to a common output node.

This difficulty arises because the CMOS image sensor 3a cannot select transmission paths for voltage signals output from the individual pixel circuits 32, voltage signals from the Gr and Gb pixel circuits 32 in adjoining columns cannot be processed by the same CDS circuit depending on the layout of the pixel circuits when shared pixel circuits are used in the CMOS image sensor 3a.

Thus, it is desirable to provide an imaging device, such as a CMOS image sensor, a control method therefor, and a camera, which can reduce vertical noise, shading and the like.

According to one embodiment of the present invention, there is provided an imaging device including a pixel section having a plurality of pixel circuits arranged in a matrix form, and a signal processing section that processes an output signal read from the pixel section, the pixel section including a first output signal line, at least one first color pixel circuit connected to the first output signal line, a second output signal line, and at least one second color pixel circuit adjacent to the first color pixel circuit in a row direction thereof and connected to the second output signal line, the signal processing section including a first signal processing circuit selectively connected to the first output signal line or the second output signal line to process an output signal of the first color pixel circuit, a second signal processing circuit that is selectively connected to that one of the first output signal line and the second output signal line which is different from the output signal line connected with the first signal processing circuit, and processes an output signal of the second color pixel circuit, a selection circuit that selects an output signal line to be connected to the first signal processing circuit and an output signal line to be connected to the second signal processing circuit from the first output signal line and the second output signal line, a first current source selectively connected to the first output signal line or the second output signal line, a second current source selectively connected to that one of the first output signal line and the second output signal line which is different from the output signal line connected with the first current source, a current source selection circuit that selects an output signal line to be connected to the first current source and an output signal line to be connected to the second current source from the first output signal line and the second output signal line, a first connection node formed on one of the first output signal line and the second output signal line which is connected with the first current source by the current source selection circuit, and a second connection node formed on one of the first output signal line and the second output signal line which is connected with the second current source by the current source selection circuit, the first connection node being formed on the first output signal line outside a first transmission path from the first color pixel circuit to the first signal processing circuit where the output signal of the first color pixel circuit is transmitted, the second connection node being formed on the second output signal line outside a second transmission path from the second color pixel circuit to the second signal processing circuit where the output signal of the second color pixel circuit is transmitted, the selection circuit connecting the first signal processing circuit to the first output signal line and connecting the second signal processing circuit to the second output signal line when the first color pixel circuit and the second color pixel circuit are driven, the current source selection circuit connecting the first current source to the first output signal line and connecting the second current source to the second output signal line when the first color pixel circuit and the second color pixel circuit are driven.

According to another embodiment of the invention, there is provided a control method for an imaging device, including a step of processing an output signal read from a pixel section having a plurality of pixel circuits arranged in a matrix form, the step having a first step of selecting an output signal line to be connected to a first signal processing circuit which processes an output signal of a first color pixel circuit and an output signal line to be connected to a second signal processing circuit which processes an output signal of a second color pixel circuit, from a first output signal line connected with at least one first color pixel circuit and a second output signal line connected with at least one second color pixel circuit adjacent to the first color pixel circuit in a row direction thereof and connected with at least one second output signal line, a second step of selecting an output signal line to be connected to a first current source and an output signal line to be connected to the second current source from the first output signal line and the second output signal line, a third step of forming a first connection node on one of the first output signal line and the second output signal line which is connected with the first current source in the second step, a fourth step of forming a second connection node formed on one of the first output signal line and the second output signal line which is connected with the second current source in the second step, a fifth step of processing the output signal of the first color pixel circuit input to the first signal processing circuit, and a sixth step of processing the output signal line of the second pixel circuit input to the second signal processing circuit, in the first step, the first signal processing circuit and the second signal processing circuit being respectively connected to the first output signal line and the second output signal line when the first color pixel circuit and the second color pixel circuit are driven, in the second step, the first current source and the second current source being respectively connected to the first output signal line and the second output signal line when the first color pixel circuit and the second color pixel circuit are driven.

According to a further embodiment of the invention, there is provided a camera including an imaging device, an optical system that guides input light to a pixel area of the imaging device, and an image processing circuit that performs image processing on an output signal output from the imaging device, the imaging device including a pixel section having a plurality of pixel circuits arranged in a matrix form, and a signal processing section that processes an output signal read from the pixel section, the pixel section including a first output signal line, at least one first color pixel circuit connected to the first output signal line, a second output signal line, and at least one second color pixel circuit adjacent to the first color pixel circuit in a row direction thereof and connected to the second output signal line, the signal processing section including a first signal processing circuit selectively connected to the first output signal line or the second output signal line to process an output signal of the first color pixel circuit, a second signal processing circuit that is selectively connected to that one of the first output signal line and the second output signal line which is different from the output signal line connected with the first signal processing circuit, and processes an output signal of the second color pixel circuit, a selection circuit that selects an output signal line to be connected to the first signal processing circuit and an output signal line to be connected to the second signal processing circuit from the first output signal line and the second output signal line, a first current source selectively connected to the first output signal line or the second output signal line, a second current source selectively connected to that one of the first output signal line and the second output signal line which is different from the output signal line connected with the first current source, a current source selection circuit that selects an output signal line to be connected to the first current source and an output signal line to be connected to the second current source from the first output signal line and the second output signal line, a first connection node formed on one of the first output signal line and the second output signal line which is connected with the first current source by the current source selection circuit, and a second connection node formed on one of the first output signal line and the second output signal line which is connected with the second current source by the current source selection circuit, the first connection node being formed on the first output signal line outside a first transmission path from the first color pixel circuit to the first signal processing circuit where the output signal of the first color pixel circuit is transmitted, the second connection node being formed on the second output signal line outside a second transmission path from the second color pixel circuit to the second signal processing circuit where the output signal of the second color pixel circuit is transmitted, the selection circuit connecting the first signal processing circuit to the first output signal line and connecting the second signal processing circuit to the second output signal line when the first color pixel circuit and the second color pixel circuit are driven, the current source selection circuit connecting the first current source to the first output signal line and connecting the second current source to the second output signal line when the first color pixel circuit and the second color pixel circuit are driven.

According to the embodiments of the invention, the signal processing section reads output signals from a plurality of pixel circuits arranged in a matrix form, and processes the output signals.

In the processing of the signal processing section, when the first color pixel circuit connected to the first output signal line and the second color pixel circuit in the same row as the first color pixel circuit are driven, the selection circuit in the signal processing section connects the first signal processing circuit to the first output signal line, and connects the second signal processing circuit to the second output signal line.

In addition, the current source selection circuit in the signal processing section connects the first current source to the first output signal line, and connects the second current source to the second output signal line.

The current source selection circuit forms the first connection node on the first output signal line outside the first transmission path from the first color pixel circuit to the first signal processing circuit where the output signal of the first color pixel circuit is transmitted.

In addition, the second connection node is formed on the second output signal line outside a second transmission path from the second color pixel circuit to the second signal processing circuit where the output signal of the second color pixel circuit is transmitted.

The output signal output on the first output signal line by the first color pixel circuit is input to the first signal processing circuit via the first transmission path. The first signal processing circuit processes the output signal of the first color pixel circuit input via the first transmission path.

The output signal output on the second output signal line by the second color pixel circuit is input to the second signal processing circuit via the second transmission path. The second signal processing circuit processes the output signal of the second color pixel circuit input via the second transmission path.

The embodiments of the invention can reduce vertical noise, shading and the like.

BRIEF DESCRIPTION OF THE DRAWINGS

FIGS. 4A to 4C are timing charts illustrating an example of the operation of the pixel circuit according to the first embodiment;

FIGS. 5A to 5D are timing charts illustrating an example of the operation of a selection control circuit according to the first embodiment;

FIG. 10 is a timing chart illustrating an example of the operation of a selection control circuit according to the second embodiment;

DETAILED DESCRIPTION OF THE PREFERRED EMBODIMENTS

Preferred embodiments of the present invention will be described below with reference to the accompanying drawings.

(First Embodiment)

Figure 1:
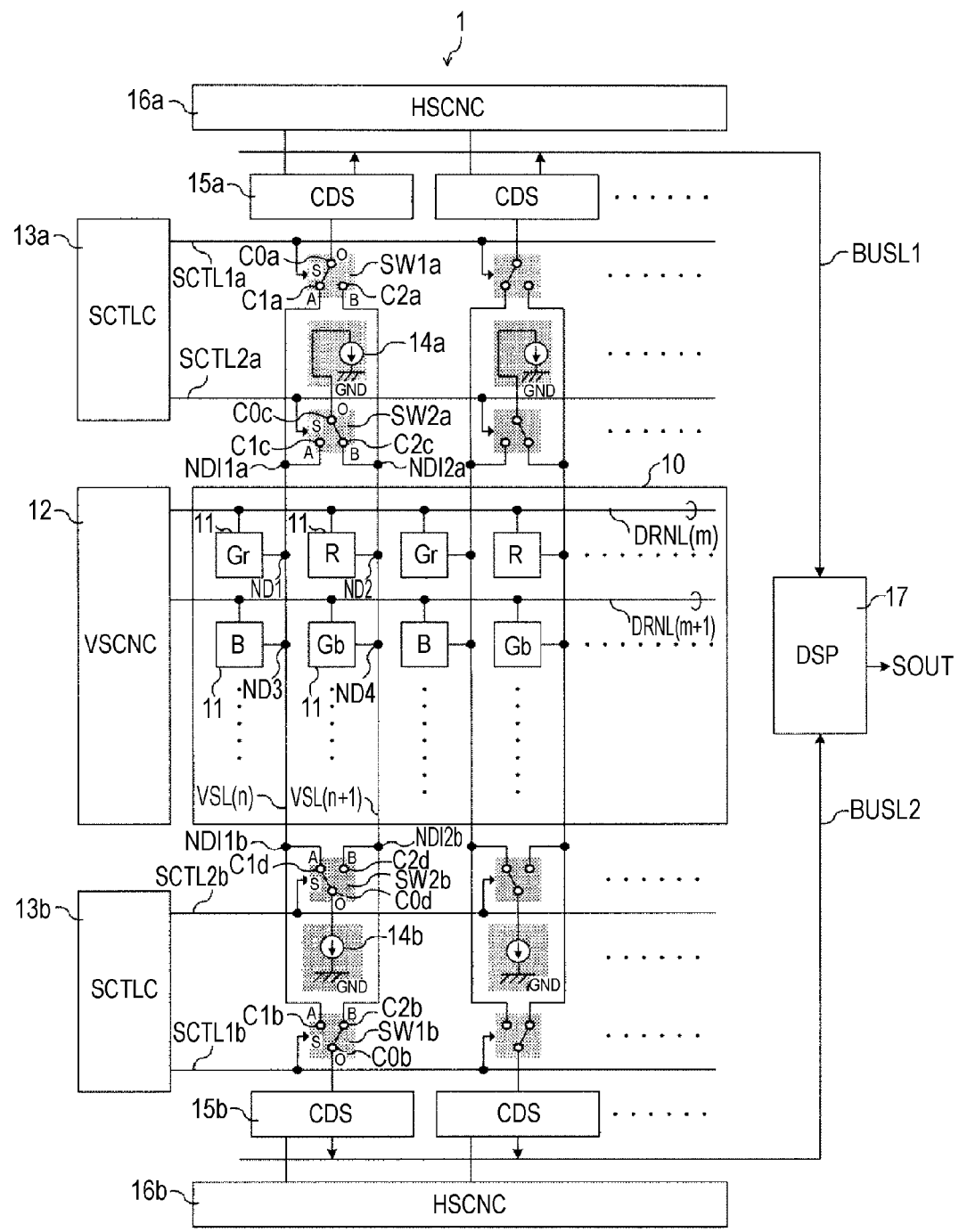
FIG. 1 is a schematic configurational diagram showing an example of the configuration of a CMOS image sensor according to a first embodiment.

FIG. 1 is a schematic configurational diagram showing an example of the configuration of a CMOS image sensor according to a first embodiment.

As shown in FIG. 1, a CMOS image sensor (CMOS) 1 has a pixel section 10 and pixel circuits 11.

The CMOS image sensor 1 further has a row drive circuit (VSCNC) 12, selection control circuits (SCTLC) 13a, 13b, current sources 14a, 14b, CDS circuits (CDS) 15a, 15b, column drive circuits (HSCNC) 16a, 16b, and a data processing circuit (DSP) 17.

As shown in FIG. 1, the selection control circuit 13a, the current sources 14a, the CDS circuits 15a, the column drive circuit 16a, first path selection switches SW1a, and first current source selection switches SW2a are arranged on that side of the pixel section 10 where pixel circuits 11 in the first row are laid out (the side will be hereunder simply referred to as "upper stage").

The selection control circuit 13b, the current sources 14b, the CDS circuits 15b, the column drive circuit 16b, second path selection switches SW1b, and second current source selection switches SW2b are arranged on that side of the pixel section 10 where pixel circuits 11 in the last row are laid out (the side will be hereunder simply referred to as "lower stage").

With this arrangement, the CMOS image sensor 1 can change the direction of reading charges from the pixel circuits 11 row by row, and allow the two stages of CDS circuits 15a, 15b to execute signal processing.

The selection control circuits 13a, 13b, the current sources 14a, 14b and the CDS circuits 15a, 15b constitute the signal processing section according to the embodiment of the invention. The first signal processing circuit according to the embodiment of the invention corresponds to the CDS circuit 15a, and the second signal processing circuit according to the embodiment of the invention corresponds to the CDS circuit 15b. The selection control circuits 13a, 13b constitute the selection circuit and current source selection circuit according to the embodiment of the invention. The first current source according to the embodiment of the invention corresponds to the lower-stage current source 14b, and the second current source according to the embodiment of the invention corresponds to the upper-stage current source 14a.

The CMOS image sensor 1 has the first path selection switch SW1a, the second path selection switch SW1b, the first current source selection switch SW2a, and the second current source selection switch SW2b.

The individual components of the CMOS image sensor 1 will be described hereinafter.

The pixel section 10 is the pixel area which receives input light, and has m (row direction) ×n (column direction) pixel circuits 11 arranged in a matrix form. m and n are positive integers, and have maximum values of, for example, 2048. The details of the pixel circuit 11 will be given below.

One of Gr (green), R (red), B (blue) and Gb (green) color filters is placed on each pixel circuit 11. The pixel circuits are laid out in a Bayer pattern to detect colors corresponding to the respective color filters.

The Gr pixel circuit 11 is laid out at the mth row and the nth column, and the R pixel circuit 11 is laid out at the mth row and the (n+1) th column. In the same row, Gr and R pixel circuits 11 are alternately laid out.

The first color pixel circuit according to the embodiment of the invention corresponds to the Gr pixel circuit 11, and the second color pixel circuit according to the embodiment of the invention corresponds to the R pixel circuit 11.

The B pixel circuit 11 is laid out at the (m+1)th row and the nth column, and the Gb pixel circuit 11 is laid out at the (m+1)th row and the (n+1)th column. In the same row, B and Gb pixel circuits 11 are alternately laid out.

The third color pixel circuit according to the embodiment of the invention corresponds to the B pixel circuit 11, and the fourth color pixel circuit according to the embodiment of the invention corresponds to the Gb pixel circuit 11.

A drive signal line DRNL(m) is commonly connected to the Gr/R pixel circuits 11 in the mth row, and a drive signal line DRNL(m+1) is commonly connected to the B/Gb pixel circuits 11 in the (m+1)th row.

Though the details will be given later, the drive signal line DRNL(n) is formed by a reset signal line (n), a transfer signal line TRNL(n), and selection signal line SELL(n).

A vertical signal line VSL(n) is commonly connected to the Gr and B pixel circuits 11 in the nth column, and a vertical signal line VSL(n+1) is commonly connected to the R and Gb pixel circuits 11 in the (n+1)th column.

The first output signal line according to the embodiment of the invention corresponds to the vertical signal line VSL(n), and the second output signal line according to the embodiment of the invention corresponds to the vertical signal line VSL(n+1).

Each of the pixel circuits 11 laid out in the above manner photoelectrically converts input light to charges (electrons), and outputs a voltage signal corresponding to the quantity of the charges to the connected vertical signal line VSL. Each pixel circuit 11 employs the circuit configuration shown in FIG. 2. An output signal according to the embodiment of the invention corresponds to a voltage signal.

Figure 2:
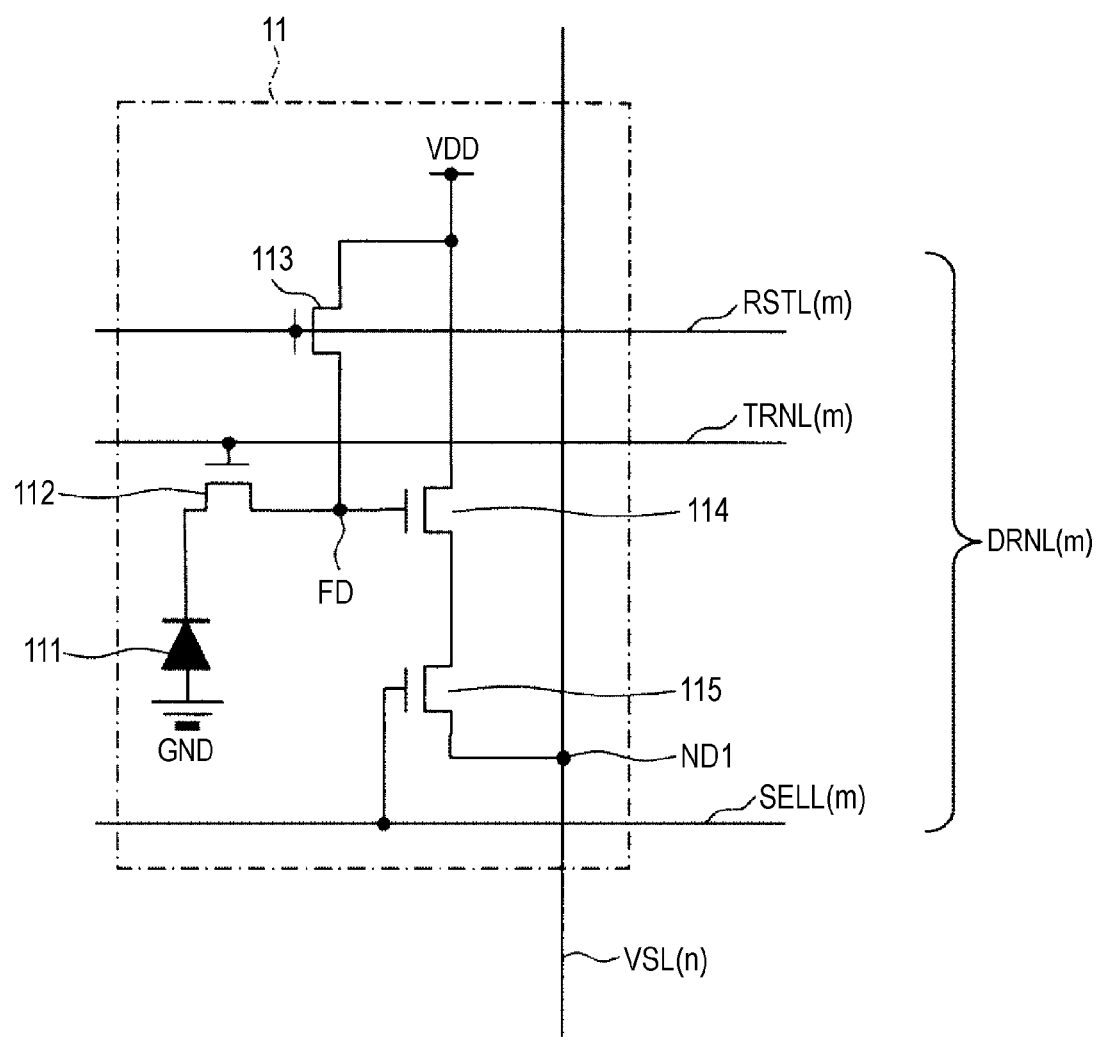
FIG. 2 is an equivalent circuit diagram showing an example of a pixel circuit according to the first embodiment.

FIG. 2 is an equivalent circuit diagram showing an example of the pixel circuit according to the first embodiment.

Because the individual pixel circuits 11 differ from one another only in the colors of the corresponding filters, the pixel circuits 11 have the same circuit configuration. FIG. 2 exemplifies the Gr pixel circuit 11 at the mth row and the nth column.

As shown in FIG. 2, the pixel circuit 11 has a photoelectric conversion element 111 formed by, for example, a photodiode, a transfer transistor 112, a reset transistor 113, an amplification transistor 114, and a selection transistor 115.

The photoelectric conversion element 111 has an anode side grounded (GND), and a cathode side connected to the source of the transfer transistor 112. The photoelectric conversion element 111 photoelectrically converts input light to charges (electrons) according to the quantity of the light, and stores the charges.

As an example, an n-channel MOSFET (Metal Oxide Semiconductor Field Effect Transistor) is used as each transistor, which takes the following connection.

The transfer transistor 112 is connected between the cathode side of the photoelectric conversion element 111 and a floating diffusion FD to transfer the charges stored in the photoelectric conversion element 111 to the floating diffusion FD. A transfer signal line TRNL(m) is connected to the gate of the transfer transistor 112.

The floating diffusion FD is connected with the drain of the transfer transistor 112, the source of the reset transistor 113, and the gate of the amplification transistor 114.

The reset transistor 113 is connected between the floating diffusion FD and a supply voltage VDD to reset the potential of the floating diffusion FD to the supply voltage VDD. A reset signal line RSTL(m) is connected to the gate of the reset transistor 113.

The amplification transistor 114 has a drain connected to the supply voltage VDD, and a source connected to the drain of the selection transistor 115. The amplification transistor 114 amplifies the potential of the floating diffusion FD.

The selection transistor 115 has its drain connected to the source of the amplification transistor 114 to be connected in series to the amplification transistor 114, and has a source connected to the vertical signal line VSL(n) via a node ND1, and a gate connected to a selection signal line SELL(m).

In reading charges from the pixel circuit 11, a high-level selection signal SEL to the selection signal line SELL(m). This turns the selection transistor 115 on, so that the voltage amplified by the amplification transistor 114 is output onto the vertical signal line VSL(n) as a voltage signal.

The first potential node according to the embodiment of the invention corresponds to the floating diffusion FD of the Gr pixel circuit 11, and the second potential node according to the embodiment of the invention corresponds to the floating diffusion FD of the R pixel circuit 11. The first transistor according to the embodiment of the invention corresponds to the amplification transistor 114 of the Gr pixel circuit 11, and the second transistor according to the embodiment of the invention corresponds to the amplification transistor 114 of the B pixel circuit 11.

As shown in FIG. 1, the row drive circuit 12 selects a row to be driven, and applies a drive signal SDRN to the drive signal line DRNL(m) to drive pixel circuits in the same row.

The selection control circuit 13a applies a selection signal S1a to a selection control line SCTL1a to control the first path selection switch SW1a. The first path selection switch SW1a is formed as shown in FIG. 3.

Figures 3A, 3B:
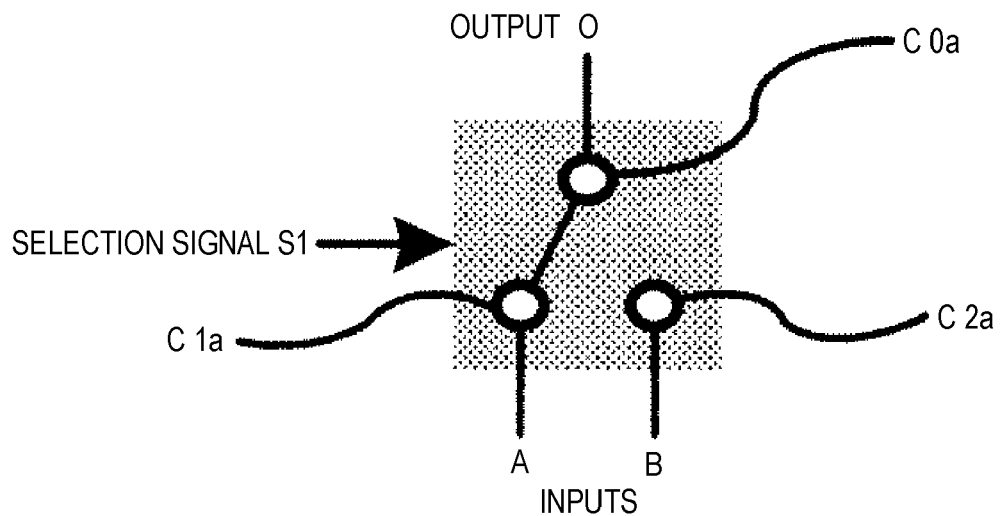
FIGS. 3A and 3B are diagrams for explaining a path selection switch according to the first embodiment.

FIGS. 3A and 3B are diagrams for explaining the path selection switches according to the first embodiment. FIG. 3A shows a conceptual diagram of the first path selection switch SW1a, and FIG. 3B is a diagram showing a control method for the first path selection switch SW1a.

As shown in FIG. 3A, the first path selection switch SW1a is a one-circuit-two-contact (single-pole double-throw) switch. The first path selection switch SW1a has a terminal C0a connected with the upper-stage CDS circuit 15a, a terminal C1a connected with the vertical signal line VSL(n), and a terminal C2a connected with the vertical signal line VSL (n+1) (see FIG. 1). FIG. 3A exemplifies a state where the terminal C0a and the terminal C1a are short-circuited.

When the selection control circuit 13a applies a low-level (L) selection signal S1a to the selection control line SCTL1a, as shown in FIG. 3B, the terminal C0a and the terminal C1a are short-circuited. While the low-level selection signal S1a is applied to the selection control line SCTL1a, a signal A at the terminal C1a is output to the terminal C0a.

When the selection control circuit 13a applies a high-level (H) selection signal S1a to the selection control line SCTL1a, on the other hand, the terminal C0a and the terminal C2a are short-circuited. While the high-level selection signal S1a is applied to the selection control line SCTL1a, a signal B at the terminal C2a is output to the terminal C0a.

The signal A corresponds to the voltage signal applied to the vertical signal line VSL(n), and the signal B corresponds to the voltage signal applied to the vertical signal line VSL (n+1).

The selection control circuit 13a applies a selection signal S2a to a selection control line SCTL2a to control the first current source selection switch SW2a.

The first current source selection switch SW2a, like the first path selection switch SW1a shown in FIG. 3A, is a one-circuit-two-contact switch. The first current source selection switch SW2a has a terminal C0c connected with the upper-stage current source 14a, a terminal C1c connected with a current supply node NDI1a, and a terminal C2c connected with the current supply node NDI2a.

The current supply node NDI1a is formed on the upper-stage vertical signal line VSL(n) of the pixel section 10, and the current supply node NDI2a is formed on the upper-stage vertical signal line VSL(n+1) of the pixel section 10.

The first current source selection switch SW2a is controlled like the first path selection switch SW1a shown in FIG. 3B. Specifically, when the selection control circuit 13a applies a low-level selection signal S2a to the selection control line SCTL2a, the terminal C0c and the terminal C1c are short-circuited. When the selection control circuit 13a applies a high-level selection signal S2a to the selection control line SCTL2a, the terminal C0c and the terminal C2c are short-circuited.

The selection control circuit 13b applies a selection signal S1b to a selection control line SCTL1b to control the second path selection switch SW1b.

The second path selection switch SW1b, like the first path selection switch SW1a shown in FIG. 3A, is a one-circuit-two-contact switch. The second path selection switch SW1b has a terminal C0b connected with the lower-stage CDS circuit 15b, a terminal C1b connected with the vertical signal line VSL(n), and a terminal C2b connected with the vertical signal line VSL(n+1).

The second path selection switch SW1b is controlled like the first path selection switch SW1a shown in FIG. 3B. Specifically, when the selection control circuit 13b applies a low-level selection signal S1b to the selection control line SCTL1b, the terminal C0b and the terminal C1b are short-circuited. When the selection control circuit 13b applies a high-level selection signal S1b to the selection control line SCTL1b, the terminal C0b and the terminal C2b are short-circuited.

The selection control circuit 13b applies a selection signal S2b to a selection control line SCTL2b to control the second current source selection switch SW2b.

The second current source selection switch SW2b, like the first path selection switch SW1a shown in FIG. 3A, is a one-circuit-two-contact switch. The second current source selection switch SW2b has a terminal C0d connected with the lower-stage current source 14b, a terminal C1d connected with a current supply node NDI1b, and a terminal C2d connected with the current supply node NDI2b.

The current supply node NDI1b is formed on the lower-stage vertical signal line VSL(n) of the pixel section 10, and the current supply node NDI2b is formed on the lower-stage vertical signal line VSL(n+1) of the pixel section 10.

The second current source selection switch SW2b is controlled like the first path selection switch SW1a shown in FIG. 3B. Specifically, when the selection control circuit 13b applies a low-level selection signal S2b to the selection control line SCTL2b, the terminal C0d and the terminal C1d are short-circuited. When the selection control circuit 13b applies a high-level selection signal S2b to the selection control line SCTL2b, the terminal C0d and the terminal C2d are short-circuited.

The upper-stage current source 14a is located on the upper stage side of the pixel section 10, and is connected to either the vertical signal line VSL(n) or the vertical signal line VSL(n+1). The upper-stage current source 14a allows a bias current to flow from the amplification transistors 114 of the R and B pixel circuits 11 to the ground (ground potential GND).

The lower-stage current source 14b is located on the lower stage side of the pixel section 10, and is connected to either the vertical signal line VSL(n) or the vertical signal line VSL(n+1). The lower-stage current source 14b allows the bias current to flow from the amplification transistors 114 of the Gr and Gb pixel circuits 11 to the ground.

The CDS circuit 15a performs a CDS (Correlated Double Sampling) process on voltage signals output from the Gr and Gb pixel circuits 11. At this time, the CDS circuit 15a senses the voltage signal twice in a selection period T (see FIGS. 4A to 4C) to be discussed later, and cancels fixed pattern noise or the like from the difference between the two voltage signals (difference in charge quantity). The CDS circuit 15a outputs processed data to the data processing circuit 17 via a bus BUSL1.

The CDS circuit 15b, like the CDS circuit 15a, performs a CDS process on voltage signals output from the R and B pixel circuits 11, and outputs processed data to the data processing circuit 17 via a bus BUSL2.

The column drive circuit 16a is formed by, for example, a shift register or the like, and selects the upper-stage CDS circuits 15a in order in synchronism with an unillustrated clock signal. The column drive circuit 16b is formed like the column drive circuit 16a, and selects the lower-stage CDS circuits 15b in order in synchronism with an unillustrated clock signal.

The data processing circuit 17 performs data processing, such as analog/digital (A/D) conversion and amplification, on data input from the CDS circuit 15a, 15b, and sends processed data as output data SOUT to an image processing circuit 22 (see FIG. 13) outside the CMOS image sensor 1.

The operation of the CMOS image sensor 1 will be described below. To begin with, the operation of the pixel circuit 11 at the mth row and the nth column shown in FIG. 2 will be described below in connection with FIGS. 4A to 4C.

FIGS. 4A to 4C are timing charts illustrating an example of the operation of the pixel circuit according to the first embodiment. FIG. 4A shows a reset signal SRST, FIG. 4B shows a transfer signal STRN, and FIG. 4C shows a selection signal SSEL.

Suppose that the row drive circuit 12 drives the Gr/R pixel circuits 11 in the mth row. First, resetting (electronic shutter) is performed on the Gr/R pixel circuits 11 in the mth row.

At time t1, the row drive circuit 12 supplies a pulse (high-level) reset signal SRST to the reset signal line RSTL(m) (see FIG. 4A), and supplies a pulse transfer signal STRN to the transfer signal line TRNL(m) (see FIG. 4B) at the same time.

The transfer transistor 112 and the reset transistor 113 simultaneously become ON in the pulse-width duration. The charges stored in the photoelectric conversion element 111 are transferred to floating diffusion FD, so that the charges stored in the photoelectric conversion element 111 are discharged to the supply voltage VDD, and the potential of the floating diffusion FD is reset to the supply voltage VDD.

After the potential resetting, the photoelectric conversion element 111 of the pixel circuit 11 starts storing charges. The period during which the pixel circuit 11 stores charges is indicated by a charge storage time $\Delta t$.

At time t2, the row drive circuit 12 supplies the pulse reset signal SRST to the reset signal line RSTL(m) (see FIG. 4A). This temporarily resets the potential of the floating diffusion FD to the supply voltage VDD.

The row drive circuit 12 supplies a high-level selection signal SSEL to the selection signal line SELL(m) from time t2 to time t6 at which reading of the charges is finished (see FIG. 4C). Accordingly, the selection transistor 115 in the pixel circuit 11 keeps the ON state until reading of the charges from the pixel circuits 11 in the same row is finished.

At time t3, the voltage signal is output to the CDS circuit 15a via the vertical signal line VSL(n). Though the details will be given later, at this time, the terminal C0a and the terminal C1a of the first path selection switch SW1a are short-circuited (see FIG. 1).

Because the transfer transistor 112 is held at the OFF state, the CDS circuit 15a senses the voltage signal during storage of the charges.

At time t4, the row drive circuit 12 supplies the pulse transfer signal STRN to the transfer signal line TRNL(m) (see FIG. 4B).

In the pulse-width duration, the transfer transistor 112 becomes ON. At this time, the reset transistor 113 is kept OFF, so that the charges stored in the photoelectric conversion element 111 are transferred to the floating diffusion FD.

Though the details will be given later, because the terminal C0d and the terminal C1d of the second current source selection switch SW2b are short-circuited, the amplification transistor 114 and the lower-stage current source 14b form a source follower circuit.

The potential of the floating diffusion FD is amplified by the amplification transistor 114. The amplified voltage signal is output to the vertical signal line VSL(n) via the selection transistor 115 by the source follower circuit (times t4 to t6).

The period during which the voltage signal is output onto the vertical signal line VSL(n) is defined to be a charge read period $\Delta ts$ (times t3 to t6), and the period from the start of resetting (time t1) to the end of reading of charges from the pixel circuit 11 (time t6) is defined to be a pixel circuit selection period T.

Next, the operation of the CMOS image sensor 1 shown in FIG. 1 will be described below in connection with FIGS. 5A to 5C.

FIGS. 5A to 5D are timing charts illustrating an example of the operation of the selection control circuit according to the first embodiment.

FIG. 5A shows the selection signal S1a, FIG. 5B shows the selection signal S2a, FIG. 5C shows the selection signal S2b, and FIG. 5D shows the selection signal S1b.

When the row drive circuit 12 drives the Gr pixel circuit 11 (mth row, nth column) and the R pixel circuit 11 (mth row, (n+1)th column), as shown in FIGS. 5A to 5D, the selection control circuits 13a, 13b perform the following operation in a selection period T1.

The selection control circuit 13a applies a low-level selection signal S1a to the selection control line SCTL1a (see FIG. 5A), and applies a high-level selection signal S2a to the selection control line SCTL2a (see FIG. 5B).

The selection control circuit 13b applies a low-level selection signal S2b to the selection control line SCTL2b (see FIG. 5C), and applies a high-level selection signal S1b to the selection control line SCTL1b (see FIG. 5D).

As a result, the terminal C0a and the terminal C1a of the first path selection switch SW1a are short-circuited, and the terminal C0b and the terminal C2b of the second path selection switch SW1b are short-circuited.

The terminal C0c and the terminal C2c of the first current source selection switch SW2a are short-circuited, and the terminal C0d and the terminal C1d of the second current source selection switch SW2b are short-circuited.

Figure 6:
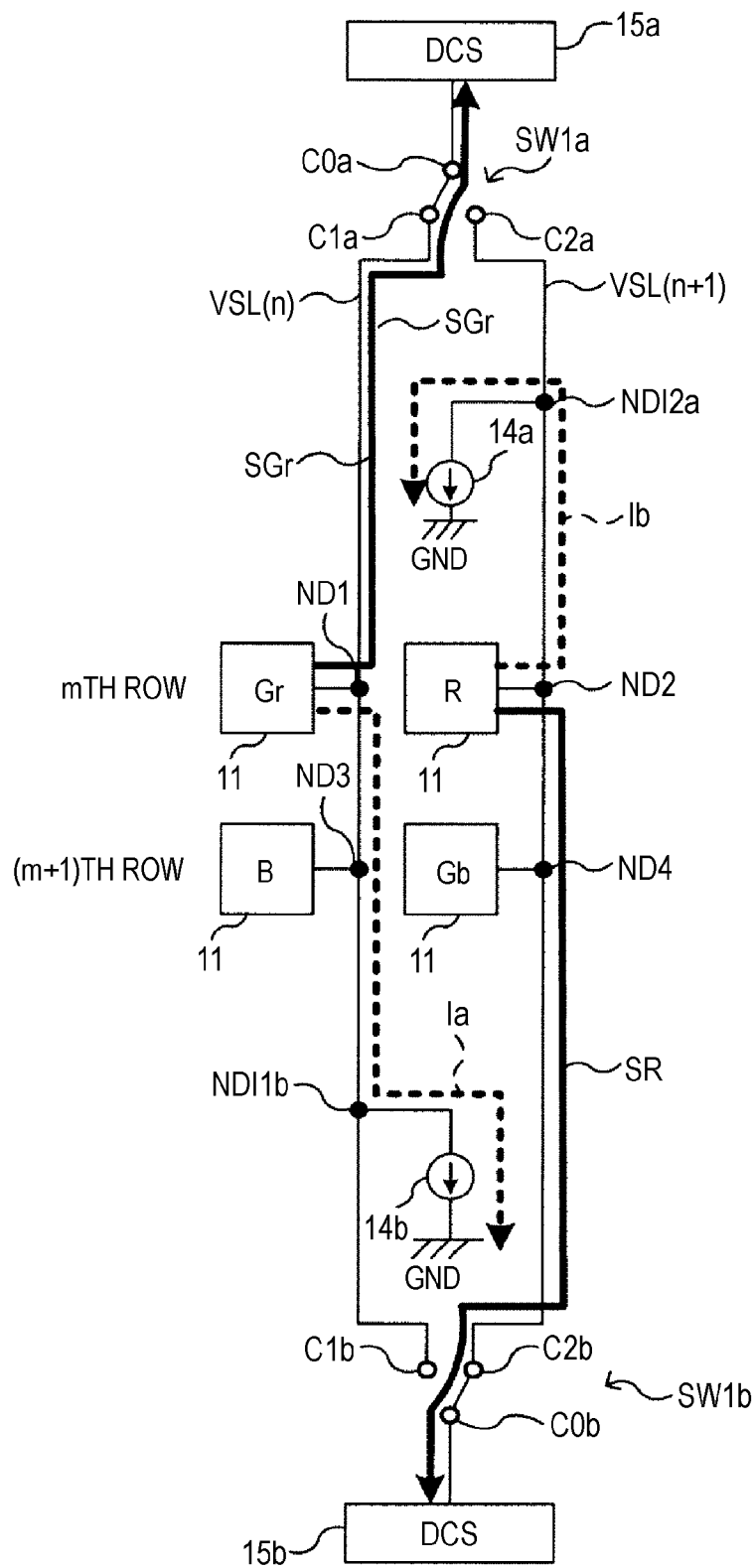
FIG. 6 is a schematic configurational diagram showing one state of the CMOS image sensor shown in FIG. 1.

FIG. 6 is a schematic configurational diagram showing one state of the CMOS image sensor 1 shown in FIG. 1. For the sake of descriptive convenience, FIG. 6 shows only a part of the CMOS image sensor 1.

As shown in FIG. 6, the vertical signal line VSL(n) is connected to the upper-stage CDS circuit 15*a*, and the vertical signal line VSL(n+1) is connected to the lower-stage CDS circuit 15*b* under the control of the selection control circuits 13*a*, 13*b*.

At this time, the amplification transistor 114 in the Gr pixel circuit 11 and the lower-stage current source 14*b* form a (first) source follower circuit.

Accordingly, a bias current Ia generated by the lower-stage current source 14*b* flows from the amplification transistor 114 of the Gr pixel circuit 11 via the node ND1 to the ground through the current supply node NDI1*b* (see a broken-line arrow in FIG. 6). Note that the first connection node according to the embodiment of the invention corresponds to the current supply node NDI1*b*.

A voltage signal SGr output from the Gr pixel circuit 11 is transmitted from the node ND1 through the vertical signal line VSL(n) to be input to the upper-stage CDS circuit 15*a* via the terminals C1*a*, C0*a* (see a solid-line arrow in FIG. 6). The transmission path for the voltage signal SGr is defined as a first transmission path Gr.

In other words, because a current source (i.e., the first connection node according to the embodiment of the invention) is not present on the first transmission path Gr, a current does not flow through the first transmission path Gr. Therefore, a voltage drop does not occur in the first transmission path Gr, keeping the first transmission path Gr at the same potential.

Further, the amplification transistor 114 in the R pixel circuit 11 and the upper-stage current source 14*a* form a (second) source follower circuit.

Accordingly, a bias current Ib generated by the upper-stage current source 14*a* flows from the amplification transistor 114 of the R pixel circuit 11 via the node ND2 to the ground through the current supply node NDI2*a* (see a broken-line arrow in FIG. 6). Note that the second connection node according to the embodiment of the invention corresponds to the current supply node NDI2*a*.

A voltage signal SR output from the R pixel circuit 11 is transmitted from the node ND2 through the vertical signal line VSL(n+1) to be input to the lower-stage CDS circuit 15*b* via the terminals C2*b*, C0*b* (see a solid-line arrow in FIG. 6). The transmission path for the voltage signal SR is defined as a second transmission path R.

In other words, because a current source (i.e., the second connection node according to the embodiment of the invention) is not present on the second transmission path R, as on the first transmission path Gr, a current does not flow through the second transmission path R. Therefore, a voltage drop does not occur in the second transmission path R, keeping the second transmission path R at the same potential.

Thereafter, the upper-stage column drive circuit 16*a* selects the upper-stage CDS circuits 15*a* in order in synchronism with an unillustrated clock signal. The upper-stage CDS circuit 15*a* performs a CDS process on the voltage signal SGr output from the Gr pixel circuit 11, and outputs processed data to the data processing circuit 17 via the bus BUSL1.

The lower-stage column drive circuit 16*b*, like the upper-stage column drive circuit 16*a*, selects the lower-stage CDS circuits 15*b* in order. The lower-stage CDS circuit 15*b* performs a CDS process on the voltage signal SR output from the R pixel circuit 11, and outputs processed data to the data processing circuit 17 via the bus BUSL2.

The data processing circuit 17 performs data processing, such as A/D conversion and amplification, on the data output from the CDS circuits 15*a*, 15*b*.

Next, when the row drive circuit 12 drives the B/Gb pixel circuits 11 in the (m+1)th row, as shown in FIGS. 5A to 5D, the selection control circuits 13*a*, 13*b* perform the following operation in a selection period T2.

The selection control circuit 13*a* applies the high-level selection signal S1*a* to the selection control line SCTL1*a* (see FIG. 5A), and applies the low-level selection signal S2*a* to the selection control line SCTL2*a* (see FIG. 5B).

The selection control circuit 13*b* applies the high-level selection signal S2*b* to the selection control line SCTL2*b* (see FIG. 5C), and applies the low-level selection signal S1*b* to the selection control line SCTL1*b* (see FIG. 5D).

As a result, the terminal C0*a* and the terminal C2*a* of the first path selection switch SW1*a* are short-circuited, and the terminal C0*b* and the terminal C1*b* of the second path selection switch SW1*b* are short-circuited.

The terminal C0*c* and the terminal C1*c* of the first current source selection switch SW2*a* are short-circuited, and the terminal C0*d* and the terminal C2*d* of the second current source selection switch SW2*b* are short-circuited.

Figure 7:
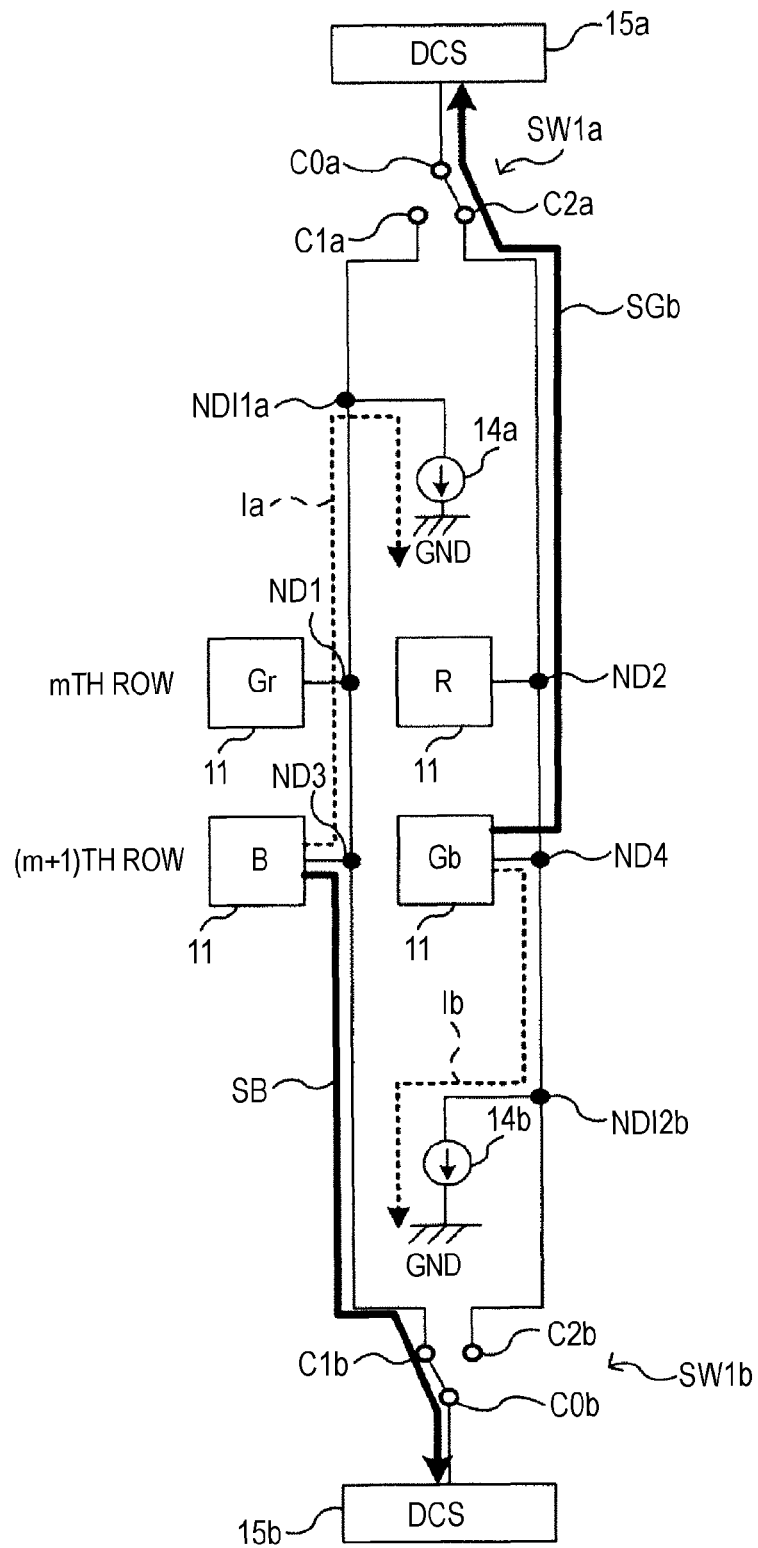
FIG. 7 is a schematic configurational diagram showing one state of the CMOS image sensor shown in FIG. 1.

FIG. 7 is a schematic configurational diagram showing one state of the CMOS image sensor 1 shown in FIG. 1. For the sake of descriptive convenience, FIG. 7 shows only a part of the CMOS image sensor 1.

As shown in FIG. 7, the vertical signal line VSL(n) is connected to the lower-stage CDS circuit 15*b*, and the vertical signal line VSL(n+1) is connected to the upper-stage CDS circuit 15*a* under the control of the selection control circuits 13*a*, 13*b*.

At this time, the amplification transistor 114 in the B pixel circuit 11 and the upper-stage current source 14*a* form a source follower circuit.

Accordingly, the bias current Ia generated by the upper-stage current source 14*a* flows from the amplification transistor 114 of the B pixel circuit 11 via a node ND3 to the ground through the current supply node NDI1*a* (see a broken-line arrow in FIG. 7).

A voltage signal SB output from the B pixel circuit 11 is transmitted from the node ND3 through the vertical signal line VSL(n) to be input to the lower-stage CDS circuit 15*b* via the terminals C1*b*, C0*b*. The transmission path for the voltage signal SB is defined as a third transmission path B.

In other words, because a current source is not present on the third transmission path B, a current does not flow through the third transmission path B. Therefore, a voltage drop does not occur in the third transmission path B, keeping the third transmission path B at the same potential.

Further, the amplification transistor 114 in the Gb pixel circuit 11 and the lower-stage current source 14*b* form a source follower circuit.

Accordingly, the bias current Ib generated by the lower-stage current source 14*b* flows from the amplification transistor 114 of the Gb pixel circuit 11 via a node ND4 to the ground through the current supply node NDI2*b* (see a broken-line arrow in FIG. 7).

A voltage signal SGb output from the Gb pixel circuit 11 is transmitted from the node ND4 through the vertical signal line VSL(n+1) to be input to the upper-stage CDS circuit 15*a* via the terminals C2*a*, C0*a*. The transmission path for the voltage signal SGb is defined as a fourth transmission path Gb.

In other words, because a current source is not present on the fourth transmission path Gb, a current does not flow through the fourth transmission path Gb. Therefore, a voltage drop does not occur in the fourth transmission path Gb, keeping the fourth transmission path Gb at the same potential.

Thereafter, the upper-stage CDS circuit 15a processes the voltage signal SGb output from the Gb pixel circuit 11, and the lower-stage CDS circuit 15b processes the voltage signal SB output from the B pixel circuit 11.

Because every transmission path is held at the same potential, as mentioned above, even when the row of pixel circuits to be driven changes from the mth row to the (m+1)th row, the input operational point of the voltage signal SGr, SGb to be input to the upper-stage CDS circuit 15a becomes constant. The input operational point of the voltage signal SB, SR to be input to the lower-stage CDS circuit 15b likewise becomes constant.

Because the input operational points of the upper-stage and lower-stage CDS circuits 15a, 15b in the CMOS image sensor 1 according to the embodiment become constant, it is possible to suppress occurrence of vertical noise, shading and the like originated from the CDS circuits.

It is unnecessary to arrange the pixel circuits shifted row by row, so that it is possible to achieve a higher integration scale of the pixel circuits, thus facilitating reduction of the voltage of the CDS circuits.

(Second Embodiment)

A second embodiment will be described below. A CMOS image sensor according to the second embodiment uses the upper-stage selection control circuit 13a alone to control the first and second path selection switches SW1a, SW1b, and the first and second current source selection switches SW2a, SW2b. The following description will be given of only the differences from the first embodiment.

Figure 8:
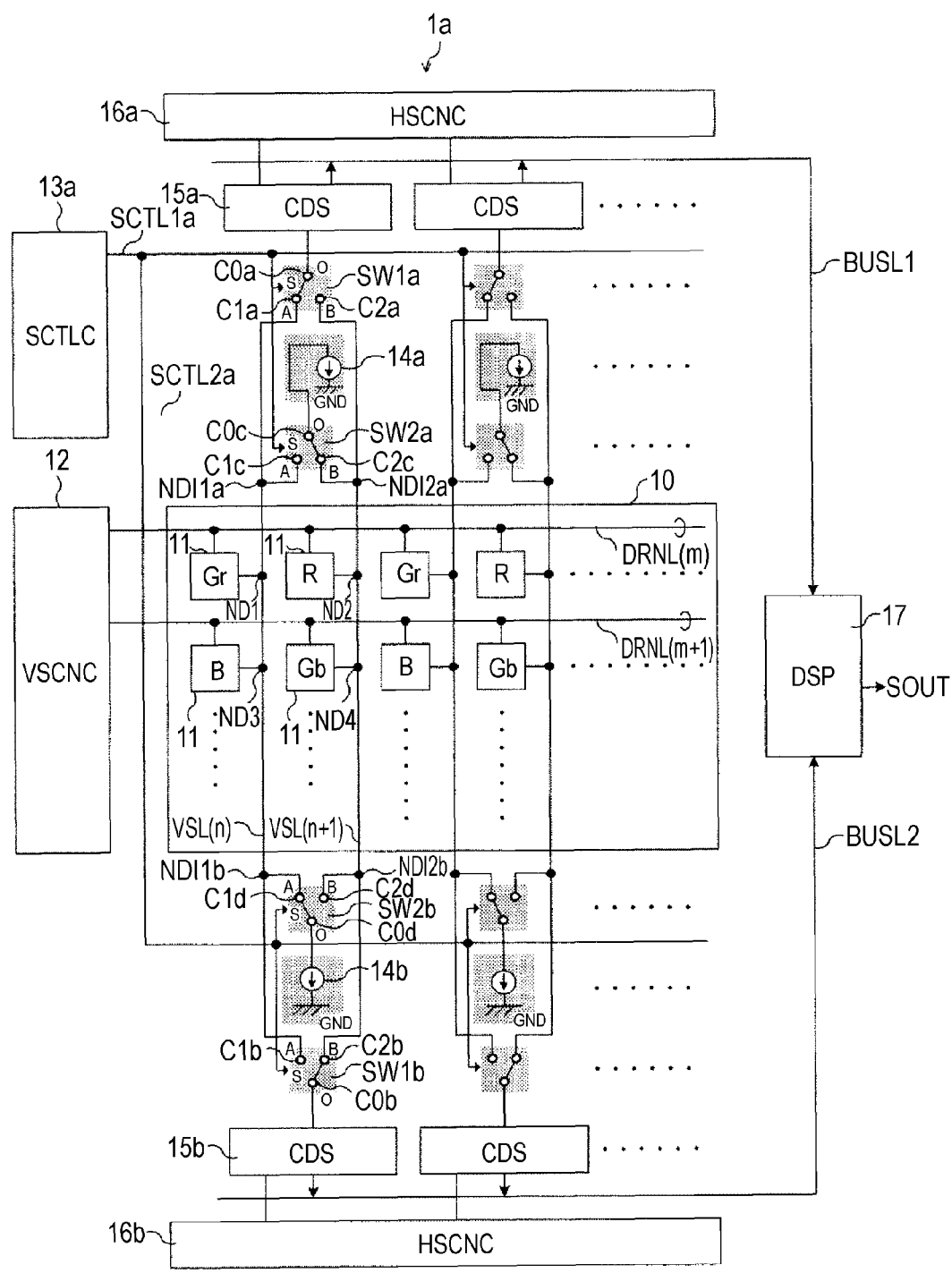
FIG. 8 is a schematic configurational diagram showing an example of the configuration of a CMOS image sensor according to a second embodiment.

FIG. 8 is a schematic configurational diagram showing an example of the configuration of a CMOS image sensor 1a according to the second embodiment.

In the CMOS image sensor 1a, as shown in FIG. 8, the upper-stage selection control circuit 13a applies a selection signal S to the selection control line SCTL1a to control the first and second path selection switches SW1a, SW1b, and the first and second current source selection switches SW2a, SW2b.

Figures 9A, 9B, 9C:
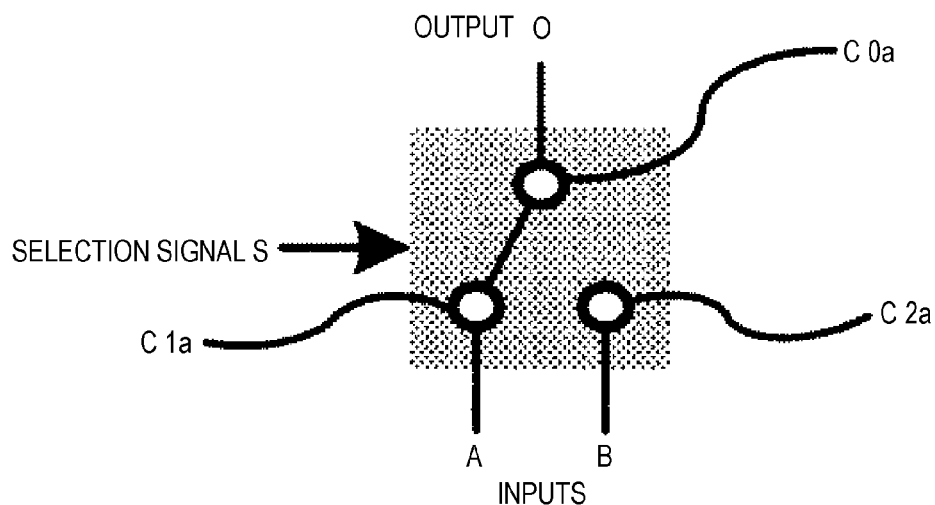
FIGS. 9A to 9C are diagrams for explaining a path selection switch and a current source selection switch according to the second embodiment.

Each switch is configured as shown in FIGS. 9A to 9C.

FIGS. 9A to 9C are diagrams for explaining the path selection switch and the current source selection switch according to the second embodiment.

FIG. 9A shows a conceptual diagram of each switch SW1a, SW1b, SW2a, SW2b. FIG. 9A exemplifies the first path selection switch SW1a.

FIG. 9B is a diagram showing a control method for the first path selection switch SW1a and the second current source selection switch SW2b, and FIG. 9C is a diagram showing a control method for the second path selection switch SW1b and the first current source selection switch SW2a.

As shown in FIG. 9A, each switch SW1a, SW1b, SW2a, SW2b is a one-circuit-two-contact switch similar to the one shown in FIG. 3A.

It is to be noted however that the first path selection switch SW1a and the second current source selection switch SW2b differ in operation from the second path selection switch SW1b and the first current source selection switch SW2a.

To begin with, the first path selection switch SW1a and the second current source selection switch SW2b will be described below.

When the selection control circuit 13a applies a low-level selection signal S to the selection control line SCTL1a, as shown in FIG. 9B, the terminal C0a and the terminal C1a of the first path selection switch SW1a are short-circuited, and the terminal C0d and the terminal C1d of the second current source selection switch SW2b are short-circuited.

When the selection control circuit 13a applies a high-level selection signal S to the selection control line SCTL1a, on the other hand, the terminal C0a and the terminal C2a of the first path selection switch SW1a are short-circuited, and the terminal C0d and the terminal C2d of the second current source selection switch SW2b are short-circuited.

Next, the second path selection switch SW1b and the first current source selection switch SW2a will be described.

When the selection control circuit 13a applies the low-level selection signal S to the selection control line SCTL1b, as shown in FIG. 9C, the terminal C0b and the terminal C2b of the second path selection switch SW1b are short-circuited, and the terminal C0c and the terminal C2c of the first current source selection switch SW2a are short-circuited.

When the selection control circuit 13a applies the high-level selection signal S to the selection control line SCTL1b, on the other hand, the terminal C0b and the terminal C1b of the second path selection switch SW1b are short-circuited, and the terminal C0c and the terminal C1c of the first current source selection switch SW2a are short-circuited.

In the CMOS image sensor 1a employing the above-described switches, the selection control circuit 13a performs the following operation in each selection period T1, T2.

FIG. 10 is a timing chart illustrating an example of the operation of the selection control circuit according to the second embodiment.

When the row drive circuit 12 drives the Gr pixel circuit 11 (mth row, nth column) and the R pixel circuit 11 (mth row, (n+1)th column), as shown in FIG. 10, the selection control circuit 13a applies the low-level selection signal S to the selection control line SCTL1a as shown in FIG. 10.

As a result, the CMOS image sensor 1a comes to a state as shown in FIG. 6.

That is, the vertical signal line VSL(n) is connected to the upper-stage CDS circuit 15a, and the vertical signal line VSL(n+1) is connected to the lower-stage CDS circuit 15b under the control of the selection control circuit 13a.

At this time, the amplification transistor 114 in the Gr pixel circuit 11 and the lower-stage current source 14b form a source follower circuit. The amplification transistor 114 in the R pixel circuit 11 and the upper-stage current source 14a form a source follower circuit.

Therefore, a current does not flow in the first transmission path Gr and the second transmission path R, keeping the transmission paths Gr, R at the same potential.

When the row drive circuit 12 drives the B pixel circuit ((m+1)th row, nth column) and the Gb pixel circuit 11 ((m+1)th row, (n+1)th column), the selection control circuit 13a applies the high-level selection signal S to the selection control line SCTL1a.

As a result, the CMOS image sensor 1a comes to a state as shown in FIG. 7.

That is, the vertical signal line VSL(n) is connected to the lower-stage CDS circuit 15b, and the vertical signal line VSL(n+1) is connected to the upper-stage CDS circuit 15a under the control of the selection control circuit 13a.

At this time, the amplification transistor 114 in the B pixel circuit 11 and the upper-stage current source 14a form a source follower circuit. The amplification transistor 114 in the Gb pixel circuit 11 and the lower-stage current source 14b form a source follower circuit.

Therefore, a current does not flow in the third transmission path B and the fourth transmission path Gb, keeping the transmission paths B, Gb at the same potential.

As a result, even when the row of pixel circuits to be driven changes from the mth row to the (m+1)th row, the input operational point of the voltage signal SGr, SGb to be input to the upper-stage CDS circuit 15*a* becomes constant, as per the first embodiment. The input operational point of the voltage signal SB, SR to be input to the lower-stage CDS circuit 15*b* likewise becomes constant.

As described in detail above, the CMOS image sensor according to this embodiment uses only the upper-stage selection control circuit 13*a* to control the individual switches SW1*a*, SW1*b*, SW2*a*, SW2*b*, thus making it possible to reduce the layout area for the CMOS image sensor.

In addition to the above advantage, not only it is possible to suppress occurrence of vertical noise, shading and the like originated from the CDS circuits, but also it is unnecessary to arrange the pixel circuits shifted row by row, thus making it possible to achieve a higher integration scale of the pixel circuits, and facilitating reduction of the voltage of the CDS circuits.

(Third Embodiment)

A third embodiment will be described below. In a CMOS image sensor according to the third embodiment, four pixel circuits arranged in the column direction share a single output node.

Figure 11:
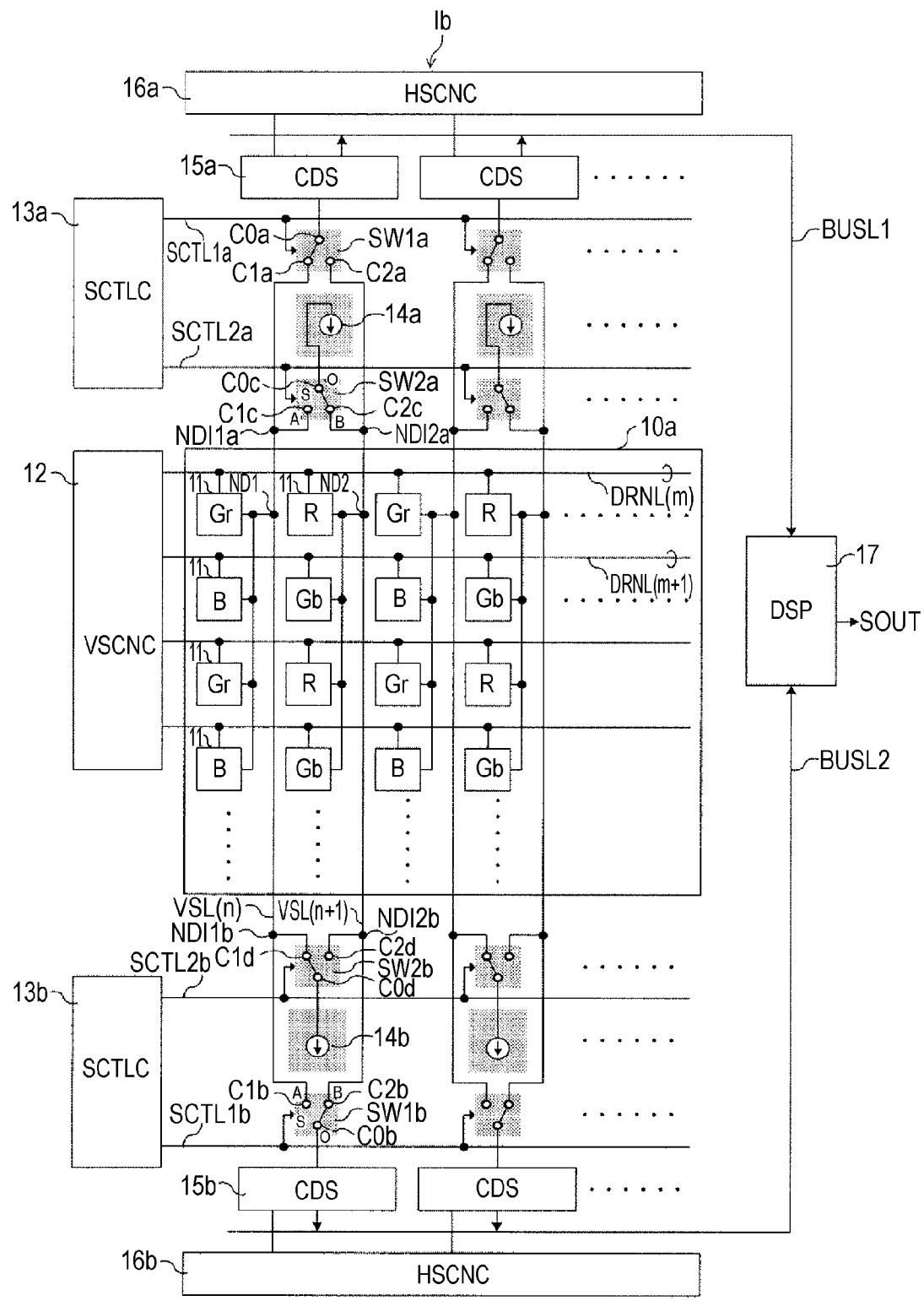
FIG. 11 is a schematic configurational diagram showing an example of the configuration of a CMOS image sensor according to a third embodiment.

FIG. 11 is a schematic configurational diagram showing an example of the configuration of a CMOS image sensor 1*b* according to the third embodiment.

As shown in FIG. 11, in a pixel section 10*a* of the CMOS image sensor 1*b*, four pixel circuits including Gr and B pixel circuits 11 in the nth column share a single node ND1, and four pixel circuits including R and Gb pixel circuits 11 in the (n+1)th column share a single node ND2. The pixel circuits with such a configuration are called "shared pixel circuits".

Note that the four pixel circuits including Gr and B pixel circuits 11 in the nth column correspond to a first pixel circuit group according to the embodiment of the invention, and the four pixel circuits including R and Gb pixel circuits 11 in the (n+1)th column correspond to a second pixel circuit group according to the embodiment of the invention. The node ND1 corresponds to a first common node according to the embodiment of the invention, and the node ND2 corresponds to a second common node according to the embodiment of the invention.

Figure 12:
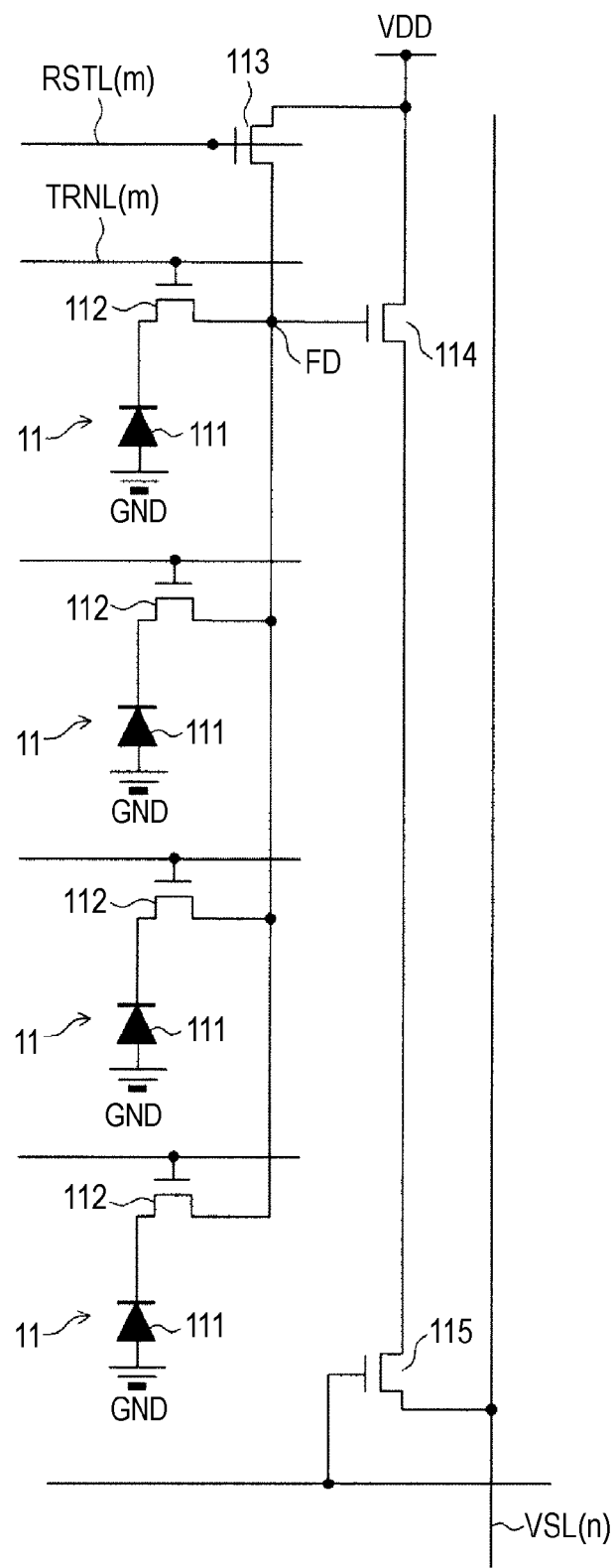
FIG. 12 is an equivalent circuit diagram showing an example of shared common pixel circuits according to the third embodiment.

FIG. 12 is an equivalent circuit diagram showing an example of shared common pixel circuits according to the third embodiment. FIG. 12 shows only the four pixel circuits in the nth column.

As shown in FIG. 12, the four pixel circuits 11 in the column direction share a floating diffusion FD, a reset transistor 113, an amplification transistor 114, and a selection transistor 115.

More specifically, each photoelectric conversion element 111 in the column direction has the anode side grounded (GND) and the cathode side connected to the source of the transfer transistor 112.

The floating diffusion FD is commonly connected with the drains of the four transfer transistors 112 in the column direction, and is connected with the source of one reset transistor 113 and the gate of one amplification transistor 114.

Even with the shared pixel circuits shown in FIG. 12, the selection control circuits 13*a*, 13*b* have only to control selection of the first and second path selection switches SW1*a*, SW1*b*, and the first and second current source selection switches SW2*a*, SW2*b* as per the first embodiment, for example.

As a result, even when the row of pixel circuits to be driven changes to the next row, the input operational point of the voltage signal to be input to the upper-stage CDS circuit 15*a* becomes constant, as per the first embodiment. The input operational point of the voltage signal to be input to the lower-stage CDS circuit 15*b* likewise becomes constant.

As described in detail above, the invention can be adapted to shared type pixel circuits.

In addition to the above advantage, not only it is possible to suppress occurrence of vertical noise, shading and the like originated from the CDS circuits, but also it is unnecessary to arrange the pixel circuits shifted row by row, thus making it possible to achieve a higher integration scale of the pixel circuits, and facilitating reduction of the voltage of the CDS circuits.

Although the selection control circuits 13*a*, 13*b* control the switches SW1*a*, SW1*b*, SW2*a*, SW2*b* in a method similar to the method of the first embodiment, the selection control circuit 13*a* may control those switches using the method of the second embodiment.

According to the embodiments of the invention, an A/D converter may be used in place of the CDS circuit.

A CMOS image sensor as an imaging device embodying the invention can be adapted as an imaging device, such as a digital camera or video camera. The following description will be given of a case where the CMOS image sensor 1 is adapted as an imaging device.

Figure 13:
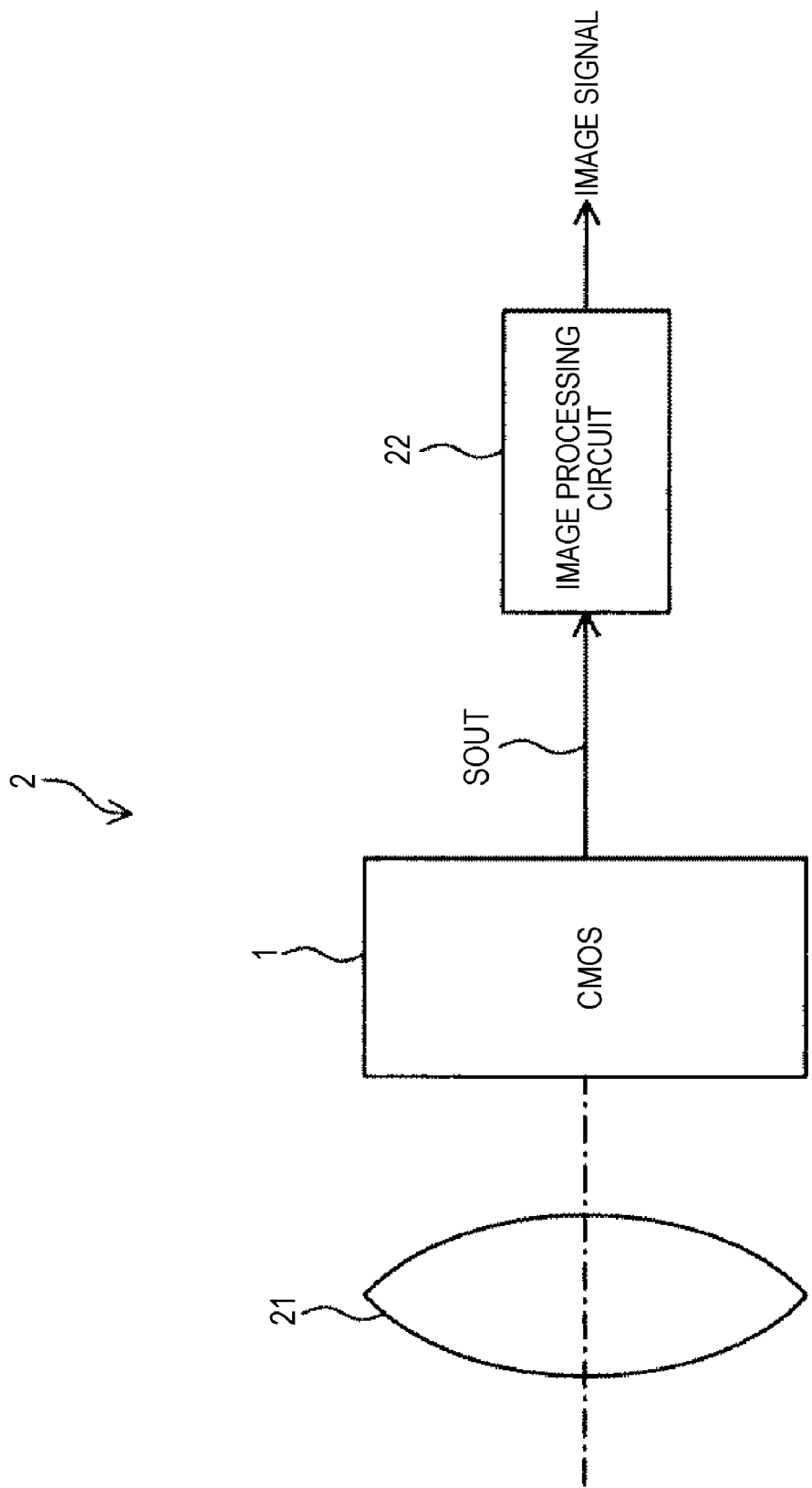
FIG. 13 is a diagram showing an example of the configuration of a camera to which the CMOS image sensors according to embodiments of the invention are adapted.
Figure 14:
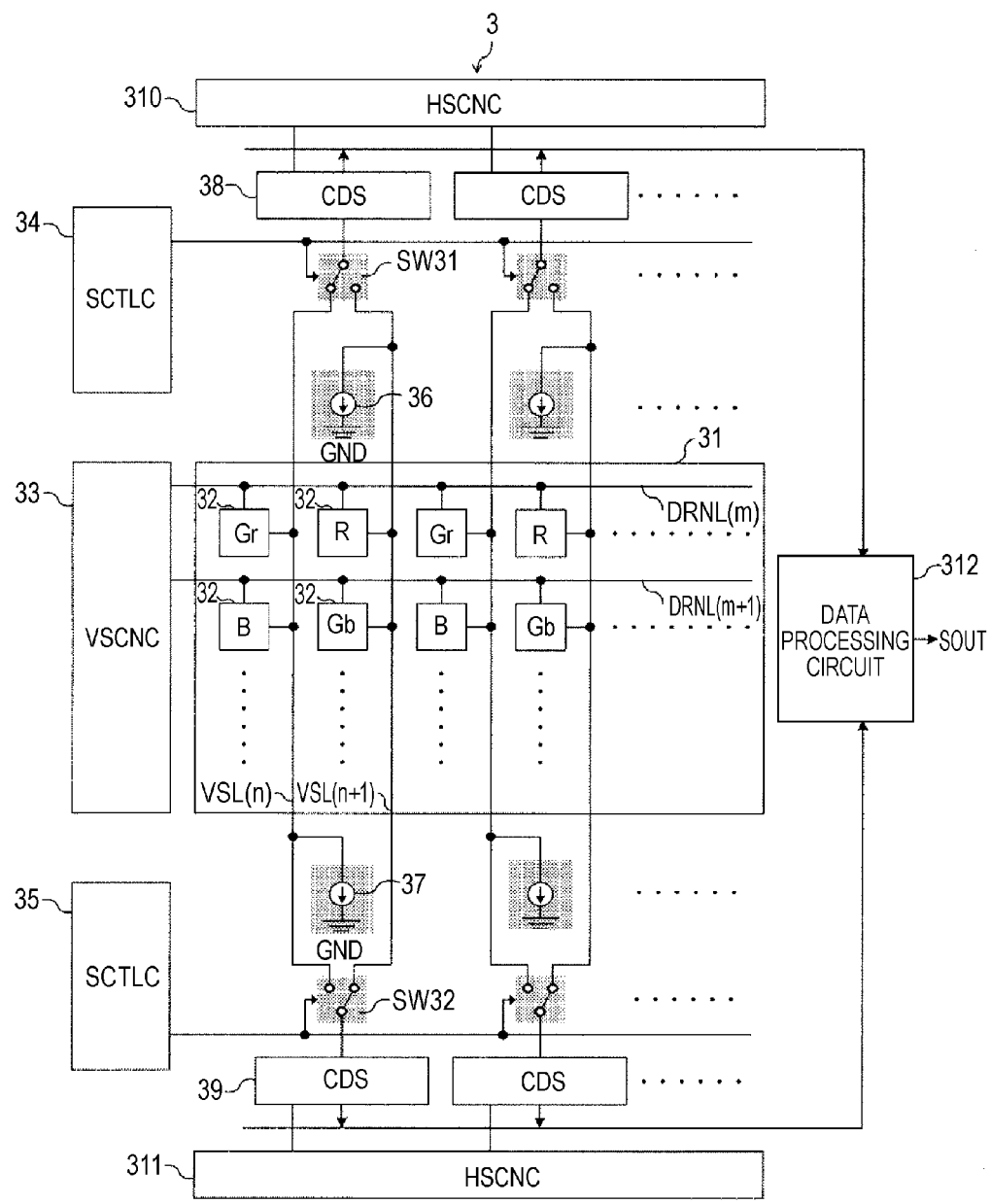
FIG. 14 is a schematic configurational diagram showing an example of the configuration of a general CMOS image sensor.
Figure 15:
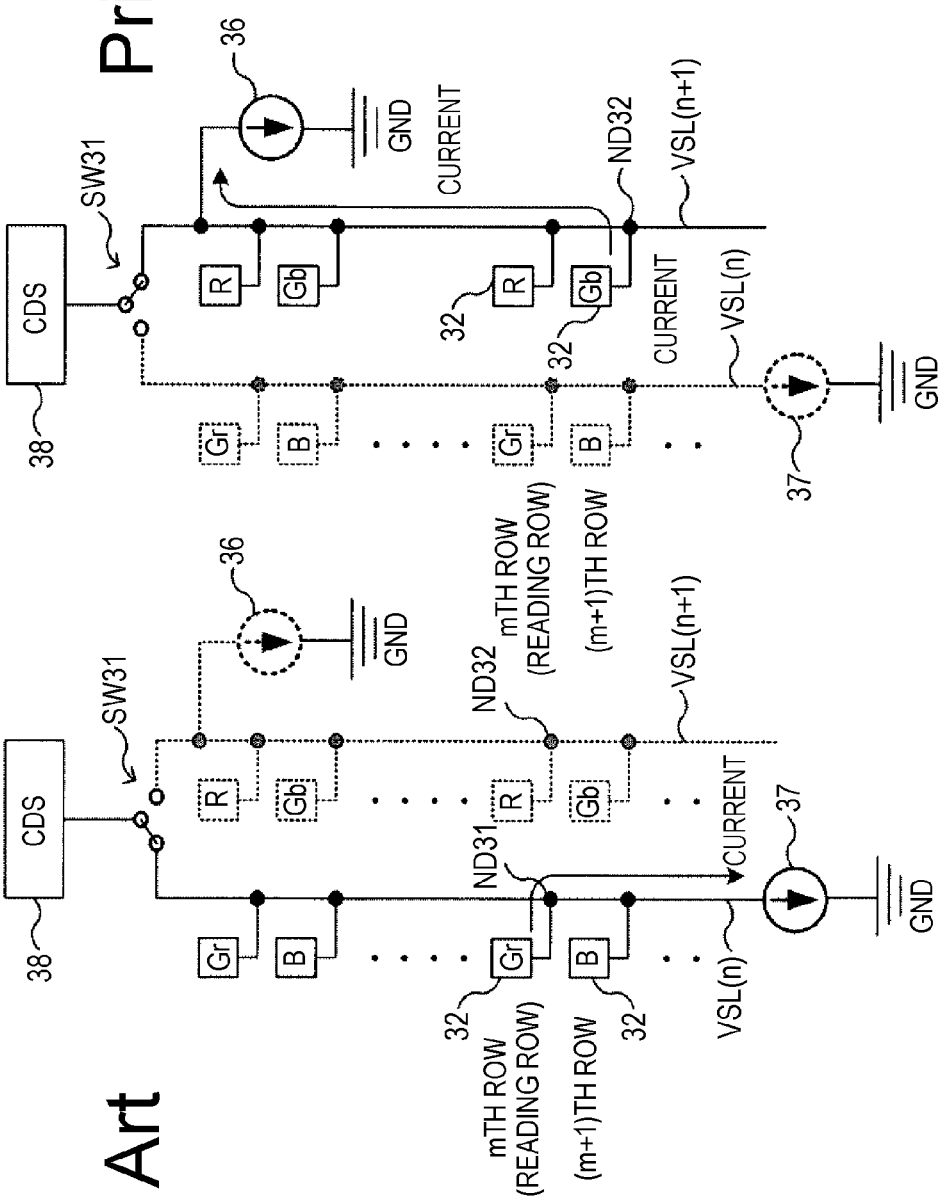
FIGS. 15A and 15B are schematic configurational diagrams each showing one state of the general CMOS image sensor.
Figure 16:
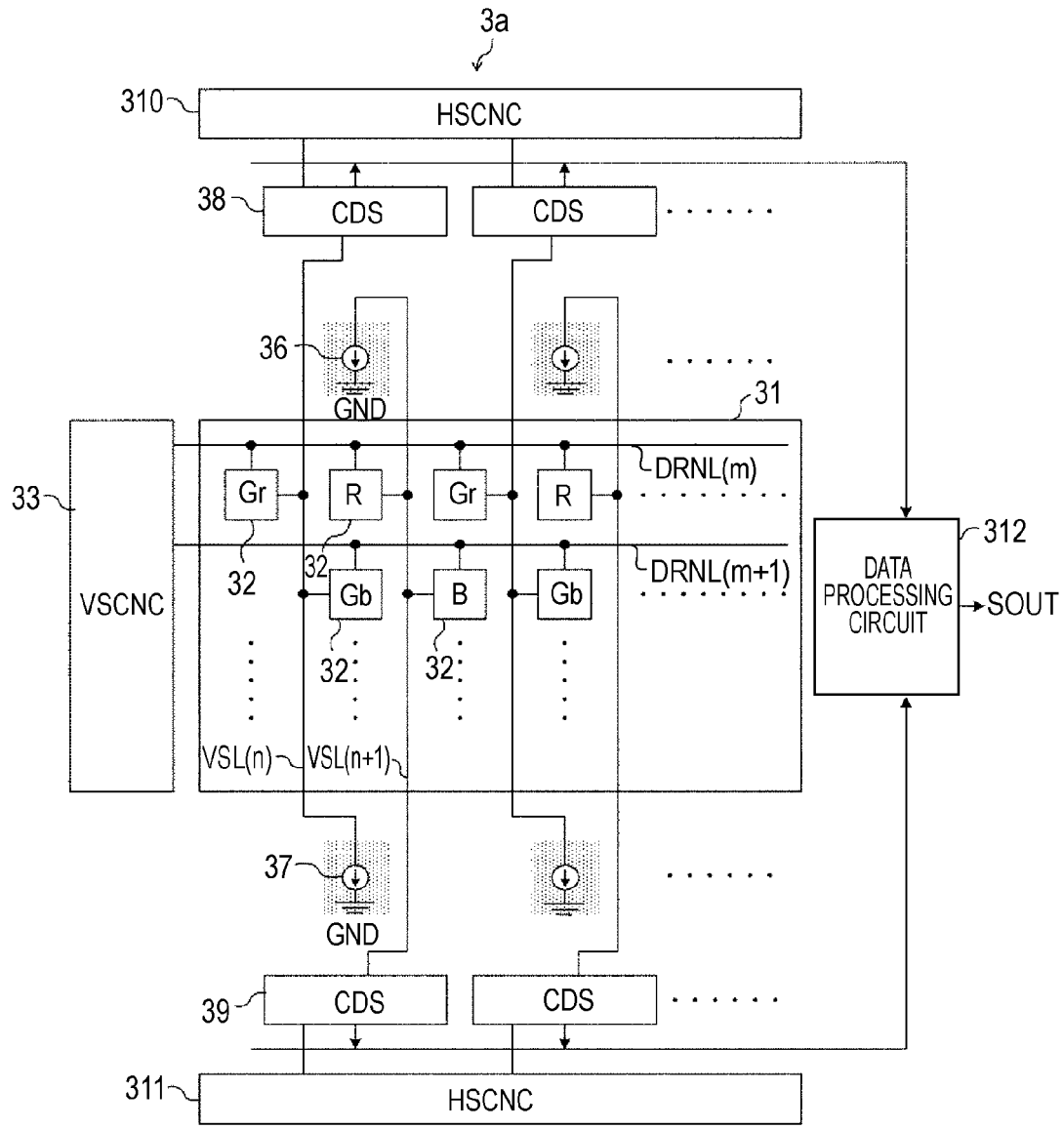
FIG. 16 is a schematic configurational diagram showing another example of the general CMOS image sensor.

FIG. 13 is a diagram showing an example of the configuration of a camera to which the CMOS image sensors according to the embodiments of the invention are adapted.

As shown in FIG. 13, a camera 2 has a CMOS image sensor 1, an optical system which guides input light to (forms a subject image on) the pixel area (pixel section 10) of the CMOS image sensor 1, and an image processing circuit 22 which processes output data SOUT of the terminal CCMOS image sensor 1. The optical system includes a lens 21 which forms, for example, the image of input light (image light) on the imaging surface.

The image processing circuit 22 performs image processing, such as color interpolation, $\gamma$ correction, RGB conversion and YUV conversion, on the output data SOUT of the CMOS image sensor 1.

An image signal processed by the image processing circuit 22 is recorded in a recording medium, such as a memory. A hard copy of image information recorded in the recording medium is obtained by a printer or the like. The image signal processed by the image processing circuit 22 is displayed as a moving picture on a monitor of a liquid crystal display or the like.

As described above, installing the CMOS image sensor 1 in a camera or the like can provide a camera which not only reduces noise, such as shading, but also executes fast reading from pixels.

The present application contains subject matter related to that disclosed in Japanese Priority Patent Application JP 2009-010030 filed in the Japan Patent Office on Jan. 20, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a pixel section having a plurality of pixel circuits arranged in a matrix form; and
   a signal processing section that processes an output signal read from the pixel section, wherein,
the pixel section includes
(a) a first output signal line,
(b) at least one first color pixel circuit connected to the first output signal line,
a second output signal line, and
(c) at least one second color pixel circuit adjacent to the first color pixel circuit in a row direction thereof and connected to the second output signal line,
the signal processing section includes
(a) a first signal processing circuit selectively connected to the first output signal line or the second output signal line to process an output signal of the first color pixel circuit,
(b) a second signal processing circuit that is selectively connected to that one of the first output signal line and the second output signal line which is different from the output signal line connected with the first signal processing circuit, and processes an output signal of the second color pixel circuit,
(c) a selection circuit that selects an output signal line to be connected to the first signal processing circuit and an output signal line to be connected to the second signal processing circuit from the first output signal line and the second output signal line,
(d) a first current source selectively connected to the first output signal line or the second output signal line,
(e) a second current source selectively connected to that one of the first output signal line and the second output signal line which is different from the output signal line connected with the first current source,
(f) a current source selection circuit that selects an output signal line to be connected to the first current source and an output signal line to be connected to the second current source from the first output signal line and the second output signal line,
(g) a first connection node formed on one of the first output signal line and the second output signal line which is connected with the first current source by the current source selection circuit, and
(h) a second connection node formed on one of the first output signal line and the second output signal line which is connected with the second current source by the current source selection circuit,
the first connection node is formed on the first output signal line outside a first transmission path from the first color pixel circuit to the first signal processing circuit where the output signal of the first color pixel circuit is transmitted,
the second connection node is formed on the second output signal line outside a second transmission path from the second color pixel circuit to the second signal processing circuit where the output signal of the second color pixel circuit is transmitted,
the selection circuit connects the first signal processing circuit to the first output signal line and connects the second signal processing circuit to the second output signal line when the first color pixel circuit and the second color pixel circuit are driven, and
the current source selection circuit connects the first current source to the first output signal line and connects the second current source to the second output signal line when the first color pixel circuit and the second color pixel circuit are driven.

2. The imaging device according to claim 1, wherein:
the first color pixel circuit has a first transistor that amplifies a potential of a first potential node supplied with photoelectrically converted charges and outputs the amplified potential of the first potential node as an output signal to the first output signal line;
the second color pixel circuit has a second transistor that amplifies a potential of a second potential node supplied with photoelectrically converted charges and outputs the amplified potential of the second potential node as an output signal to the second output signal line;
the first current source together with the first transistor of the first color pixel circuit forms a first source follower circuit; and
the second current source together with the second transistor of the second color pixel circuit forms a second source follower circuit.

3. The imaging device according to claim 2, wherein the pixel section further includes:
a third color pixel circuit connected to the first output signal line; and
a fourth color pixel circuit adjacent to the third color pixel circuit in a row direction thereof and connected to the second output signal line,
wherein,
the first signal processing circuit processes the output signal of the first color pixel circuit and an output signal of the fourth color pixel circuit,
the second signal processing circuit processes the output signal of the second color pixel circuit and an output signal of the third color pixel circuit,
the selection circuit connects the first signal processing circuit to the first output signal line and connects the second signal processing circuit to the second output signal line when the first color pixel circuit and the second color pixel circuit are driven, and connects the first signal processing circuit to the second output signal line and connects the second signal processing circuit to the first output signal line when the third color pixel circuit and the fourth color pixel circuit are driven, and
the current source selection circuit connects the first current source to the first output signal line and connects the second current source to the second output signal line when the first color pixel circuit and the second color pixel circuit are driven, and
connects the first current source to the second output signal line and connects the second current source to the first output signal line when the third color pixel circuit and the fourth color pixel circuit are driven.

4. The imaging device according to claim 3, comprising:
a first pixel circuit group having a plurality of pixel circuits in a column direction including at least one of the first color pixel circuit and the third color pixel circuit;
a second pixel circuit group having a plurality of pixel circuits in the column direction including at least one of the second color pixel circuit and the fourth color pixel circuit;
a first common node formed on the first output signal line; and
a second common node formed on the second output signal line,
wherein,
each pixel circuit in the first pixel circuit group outputs an output signal of the each pixel circuit to the first common node, and each pixel circuit in the second pixel circuit group outputs an output signal of the each pixel circuit to the second common node.

5. A control method for an imaging device, including processing an output signal read from a pixel section having a plurality of pixel circuits arranged in a matrix form, the method comprising:
 a first step of selecting an output signal line to be connected to a first signal processing circuit which processes an output signal of a first color pixel circuit and an output signal line to be connected to a second signal processing circuit which processes an output signal of a second color pixel circuit, from a first output signal line connected with at least one first color pixel circuit and a second output signal line connected with at least one second color pixel circuit adjacent to the first color pixel circuit in a row direction thereof and connected with at least one second output signal line;
 a second step of selecting an output signal line to be connected to a first current source and an output signal line to be connected to the second current source from the first output signal line and the second output signal line;
 a third step of forming a first connection node on one of the first output signal line and the second output signal line which is connected with the first current source in the second step;
 a fourth step of forming a second connection node formed on one of the first output signal line and the second output signal line which is connected with the second current source in the second step;
 a fifth step of processing the output signal line of the first color pixel circuit input to the first signal processing circuit; and
 a sixth step of processing the output signal line of the second color pixel circuit input to the second signal processing circuit,
 wherein,
 in the first step, the first signal processing circuit and the second signal processing circuit are respectively connected to the first output signal line and the second output signal line when the first color pixel circuit and the second color pixel circuit are driven,
 in the second step, the first signal processing circuit and the second signal processing circuit are respectively connected to the first output signal line the first current source and the second current source being respectively connected to the first output signal line when the first color pixel circuit and the second color pixel circuit are driven.

6. A camera comprising:
 an imaging device;
 an optical system that guides input light to a pixel area of the imaging device; and
 an image processing circuit that performs image processing on an output signal output from the imaging device,
 wherein,
 the imaging device includes
  (a) a pixel section having a plurality of pixel circuits arranged in a matrix form, and
  (b) a signal processing section that processes an output signal read from the pixel section,
 the pixel section includes
  (a) a first output signal line,
  (b) at least one first color pixel circuit connected to the first output signal line,
  (c) a second output signal line, and
  (d) at least one second color pixel circuit adjacent to the first color pixel circuit in a row direction thereof and connected to the second output signal line,
 the signal processing section includes
  (a) a first signal processing circuit selectively connected to the first output signal line or the second output signal line to process an output signal of the first color pixel circuit,
  (b) a second signal processing circuit that is selectively connected to that one of the first output signal line and the second output signal line which is different from the output signal line connected with the first signal processing circuit, and processes an output signal of the second color pixel circuit,
  (c) a selection circuit that selects an output signal line to be connected to the first signal processing circuit and an output signal line to be connected to the second signal processing circuit from the first output signal line and the second output signal line,
  (d) a first current source selectively connected to the first output signal line or the second output signal line,
  (e) a second current source selectively connected to that one of the first output signal line and the second output signal line which is different from the output signal line connected with the first current source,
  (f) a current source selection circuit that selects an output signal line to be connected to the first current source and an output signal line to be connected to the second current source from the first output signal line and the second output signal line,
  (g) a first connection node formed on one of the first output signal line and the second output signal line which is connected with the first current source by the current source selection circuit, and
  (h) a second connection node formed on one of the first output signal line and the second output signal line which is connected with the second current source by the current source selection circuit,
 the first connection node is formed on the first output signal line outside a first transmission path from the first color pixel circuit to the first signal processing circuit where the output signal of the first color pixel circuit is transmitted,
 the second connection node is formed on the second output signal line outside a second transmission path from the second color pixel circuit to the second signal processing circuit where the output signal of the second color pixel circuit is transmitted,
 the selection circuit connects the first signal processing circuit to the first output signal line and connects the second signal processing circuit to the second output signal line when the first color pixel circuit and the second color pixel circuit are driven,
 the current source selection circuit connects the first current source to the first output signal line and connects the second current source to the second output signal line when the first color pixel circuit and the second color pixel circuit are driven.

* * * * *